US012765095B2

(12) United States Patent
Toda

(10) Patent No.: US 12,765,095 B2
(45) Date of Patent: Oct. 13, 2026

(54) OPTICAL DETECTOR AND ELECTRONIC APPARATUS INCLUDING METASURFACE ELEMENTS AND COMPLEMENTARY COLOR FILTERS FOR COLOR SEPARATION

(71) Applicant: SONY SEMICONDUCTOR SOLUTIONS CORPORATION, Kanagawa (JP)

(72) Inventor: Atsushi Toda, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 320 days.

(21) Appl. No.: 18/293,296

(22) PCT Filed: Jul. 29, 2022

(86) PCT No.: PCT/JP2022/029348
§ 371 (c)(1),
(2) Date: Jan. 29, 2024

(87) PCT Pub. No.: WO2023/013554
PCT Pub. Date: Feb. 9, 2023

(65) Prior Publication Data
US 2024/0339469 A1 Oct. 10, 2024

(30) Foreign Application Priority Data
Aug. 6, 2021 (JP) ................................ 2021-130012

(51) Int. Cl.
*H10F 39/00* (2025.01)
*H10F 39/18* (2025.01)

(52) U.S. Cl.
CPC ....... *H10F 39/8053* (2025.01); *H10F 39/182* (2025.01); *H10F 39/802* (2025.01); *H10F 39/806* (2025.01)

(58) Field of Classification Search
CPC .. H10F 39/8053; H10F 39/182; H10F 39/802; H10F 39/806; H10F 39/12;
(Continued)

(56) References Cited

U.S. PATENT DOCUMENTS

2004/0090550 A1* 5/2004 Park ..................... H04N 25/133 348/E5.045
2006/0291056 A1* 12/2006 Murata ................ H10F 39/802 359/487.03
(Continued)

FOREIGN PATENT DOCUMENTS

JP 2020-123964 A 8/2020
JP 2021-067691 A 4/2021
(Continued)

OTHER PUBLICATIONS

International Search Report and Written Opinion of PCT Application No. PCT/JP2022/029348, issued on Oct. 25, 2022, 09 pages of ISRWO.

*Primary Examiner* — Usman A Khan
(74) *Attorney, Agent, or Firm* — CHIP LAW GROUP

(57) ABSTRACT

Provided is an optical detector that includes a photoelectric conversion layer in which photoelectric conversion elements are in a matrix shape and a filter layer including complementary color filters on an incident surface of the photoelectric conversion layer, where each of the complementary color filters blocks a specific wavelength in the incident light. The optical detector further includes a metasurface layer including metasurface elements between the photoelectric conversion layer and the filter layer, where each of the metasurface elements is associated with a corresponding
(Continued)

set of photoelectric conversion elements of the photoelectric conversion elements, and each of the metasurface elements includes refractive index materials. Each of the metasurface elements separates, by wavelengths, light having passed through the complementary color filters, into components through the refractive index materials, and guides the components of the light separated by wavelengths toward the corresponding set of photoelectric conversion elements.

12 Claims, 23 Drawing Sheets

(58) Field of Classification Search
CPC ........ H10F 39/8063; H10F 77/40; G01J 1/02; G01J 1/04; G02B 5/20
USPC .......................................................... 348/273
See application file for complete search history.

(56) References Cited

U.S. PATENT DOCUMENTS

| | | | | |
|---|---|---|---|---|
| 2017/0205675 | A1* | 7/2017 | Chen | G02F 1/136286 |
| 2020/0266230 | A1* | 8/2020 | Miyata | H10F 39/8053 |
| 2022/0223642 | A1* | 7/2022 | Hoshi | H10F 39/8057 |

FOREIGN PATENT DOCUMENTS

| | | | | |
|---|---|---|---|---|
| WO | 2019/202890 A1 | | 10/2019 | |
| WO | 2020/036025 A1 | | 2/2020 | |
| WO | 2020/095674 A1 | | 5/2020 | |
| WO | WO-2020158164 A1 | * | 8/2020 | H04N 25/70 |

* cited by examiner

OPTICAL DETECTOR AND ELECTRONIC APPARATUS INCLUDING METASURFACE ELEMENTS AND COMPLEMENTARY COLOR FILTERS FOR COLOR SEPARATION

CROSS REFERENCE TO RELATED APPLICATIONS

This application is a U.S. National Phase of International Patent Application No. PCT/JP2022/029348 filed on Jul. 29, 2022, which claims priority benefit of Japanese Patent Application No. JP 2021-130012 filed in the Japan Patent Office on Aug. 6, 2021. Each of the above-referenced applications is hereby incorporated herein by reference in its entirety.

TECHNICAL FIELD

The present disclosure relates to an optical detector and an electronic apparatus equipped with the optical detector.

BACKGROUND ART

In recent years, in order to realize an optical detector that measures a distance with high resolution or obtains a high-resolution distance image, there has been an approach of increasing the number of pixels (pixel density) per unit area by a technology of manufacturing a high-density and fine semiconductor. Meanwhile, when the size of each pixel is reduced by the technology of manufacturing a high-density and fine semiconductor, the number of photons entering one pixel is reduced. As a result, the sensitivity is degraded. In order to enhance sensitivity, an imaging element that separates light into components by means of an on-chip color splitter using metasurface elements (meta-material structure) has been proposed (for example, PTL 1 and PTL 2).

CITATION LIST

Patent Literature

[PTL 1]
Japanese Patent Laid-Open No. 2020-123964
[PTL 2]
Japanese Patent Laid-Open No. 2021-067691

SUMMARY

Technical Problems

However, it is difficult to design an imaging element using the technology disclosed in PTL 1 and PTL 2 because this technology separates light by three colors. In addition, crosstalk is large, and a matrix coefficient of a color correction computation is large, so that noise is generated after signal processing. Furthermore, this technology has an adverse influence on the color reproduction property.

The present disclosure has been achieved in view of the abovementioned circumstances, and an object thereof is to provide an optical detector and an electronic apparatus in which the sensitivity is enhanced, occurrence of crosstalk can be suppressed, and good color reproduction property can be attained.

Solution to Problems

One aspect of the present disclosure is an optical detector including a photoelectric conversion layer in which a plurality of photoelectric conversion elements that generate electric charges by photoelectric conversion based on incident light are formed in a matrix shape, a filter layer including a plurality of complementary color filters that are arranged on an incident surface of the photoelectric conversion layer in a manner corresponding to the plurality of photoelectric conversion elements and that each block light of a specific wavelength in the incident light, and a metasurface layer including a plurality of metasurface elements that are arranged between the photoelectric conversion layer and the filter layer in a manner corresponding to the plurality of photoelectric conversion elements and that each include a plurality of refractive index materials varying according to wavelengths and having a pitch smaller than a target light wavelength, in which each of the plurality of metasurface elements separates, by wavelengths, light having passed through the complementary color filters, into components through the plurality of refractive index materials, and guide the components of the light separated by wavelengths toward the corresponding photoelectric conversion elements.

Another aspect of the present disclosure is an electronic apparatus including an optical detector including a photoelectric conversion layer in which a plurality of photoelectric conversion elements that generate electric charges by photoelectric conversion based on incident light are formed in a matrix shape, a filter layer including a plurality of complementary color filters that are arranged on an incident surface of the photoelectric conversion layer in a manner corresponding to the plurality of photoelectric conversion elements and that each block a specific wavelength in the incident light, and a metasurface layer including a plurality of metasurface elements that are arranged between the photoelectric conversion layer and the filter layer in a manner corresponding to the plurality of photoelectric conversion elements and that each include a plurality of refractive index materials varying according to wavelengths and having a pitch smaller than a target light wavelength, each of the plurality of metasurface elements separating, by wavelengths, light having passed through the complementary color filters, into components through the plurality of refractive index materials, and guiding the components of the light separated by wavelengths toward the corresponding photoelectric conversion elements.

DESCRIPTION OF EMBODIMENTS

Figure 1:
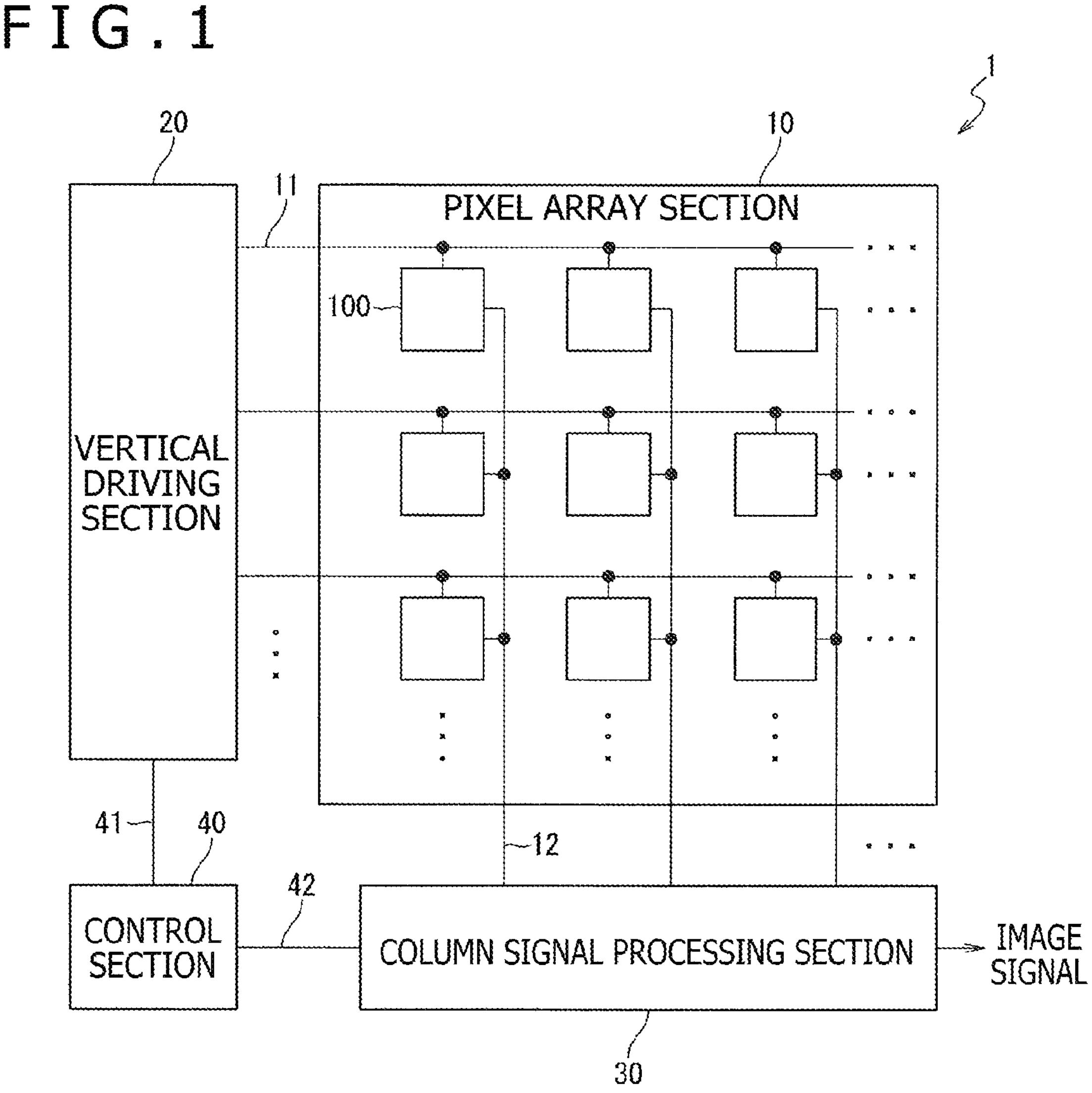
FIG. 1 is a diagram depicting a configuration example of an optical detector according to a first embodiment of the present technology.

Hereinafter, embodiments of the present disclosure will be explained with reference to the drawings. In the drawings which will be explained below, the identical or corresponding elements are denoted by the same reference sign, and a redundant explanation thereof will be omitted. Since the drawings are schematically depicted, it is to be noted that the relation between a thickness and a planar size, the thickness ratio between devices or members, etc., are different from actual ones. Therefore, a specific thickness, a specific size, etc. should be determined in view of the following explanation. In addition, it is needless to say that the size relation and the ratio vary across the drawings.

Moreover, in the following explanation, an up-down direction or the like is defined just for convenience of explanation. This definition is not intended to specify the technical concept of the present disclosure. For example, when a subject that is rotated by 90 degrees is observed, an up-down direction is translated into a left-right direction, or when a subject that is rotated by 180 degrees is observed, an up-down direction is translated into the vertically inversed direction.

It is to be noted that the effects described in the present description are just examples, and thus, are not restrictive. In addition, any other effect may be provided.

First Embodiment (Configuration of Optical Detector)

FIG. 1 is a diagram depicting a configuration example of an optical detector according to a first embodiment of the present technology. An optical detector 1 depicted in FIG. 1 includes a pixel array section 10, a vertical driving section 20, a column signal processing section 30, and a control section 40. The pixel array section 10 includes pixels 100 that are arranged in a two-dimensional lattice shape. The pixels 100 are each configured to generate an image signal according to light applied thereto.

Each pixel 100 includes a photoelectric conversion element that generates an electric charge according to the applied light. In addition, each pixel 100 further includes a pixel circuit. The pixel circuit generates an image signal based on the electric charge generated by the photoelectric conversion element. Generation of an image signal is controlled by a control signal generated by the vertical driving section 20, which will be explained later.

Signal lines 11 and 12 are arranged in an XY matrix shape in the pixel array section 10. Through the signal lines 11, control signals of the pixel circuits of the pixels 100 are transmitted. The signal lines 11 are arranged for respective rows of the pixel array section 10. Each signal line 11 is shared by the pixels 100 that are arranged in the corresponding row.

Through the signal lines 12, image signals generated by the pixel circuits of the pixels 100 are transmitted. The signal lines 12 are arranged for respective columns of the pixel array section 10. Each signal line 12 is shared by the pixels 100 that are arranged in the corresponding column. The photoelectric conversion elements and the pixel circuits are formed on a semiconductor board. The vertical driving section 20 generates a control signal for the pixel circuits of the pixels 100.

The vertical driving section 20 transmits the generated control signal to the pixels 100 via the signal lines 11 depicted in FIG. 1. The column signal processing section 30 processes image signals generated by the pixels 100. The column signal processing section 30 processes image signals that are transmitted from the pixels 100 via the signal lines 12 depicted in FIG. 1.

For example, the processing at the column signal processing section 30 is analog-digital conversion of converting analog image signals generated by the pixels 100 into digital image signals. An image signal having undergone the processing at the column signal processing section 30 is outputted as an image signal of the optical detector 1.

The control section 40 controls the whole optical detector 1. To control the optical detector 1, the control section 40 generates and outputs control signals for controlling the vertical driving section 20 and the column signal processing section 30. The control signals generated by the control section 40 are transmitted to the vertical driving section 20 and the column signal processing section 30 via a signal line 41 and a signal line 42, respectively.

(Pixel Configuration)

Figure 2:
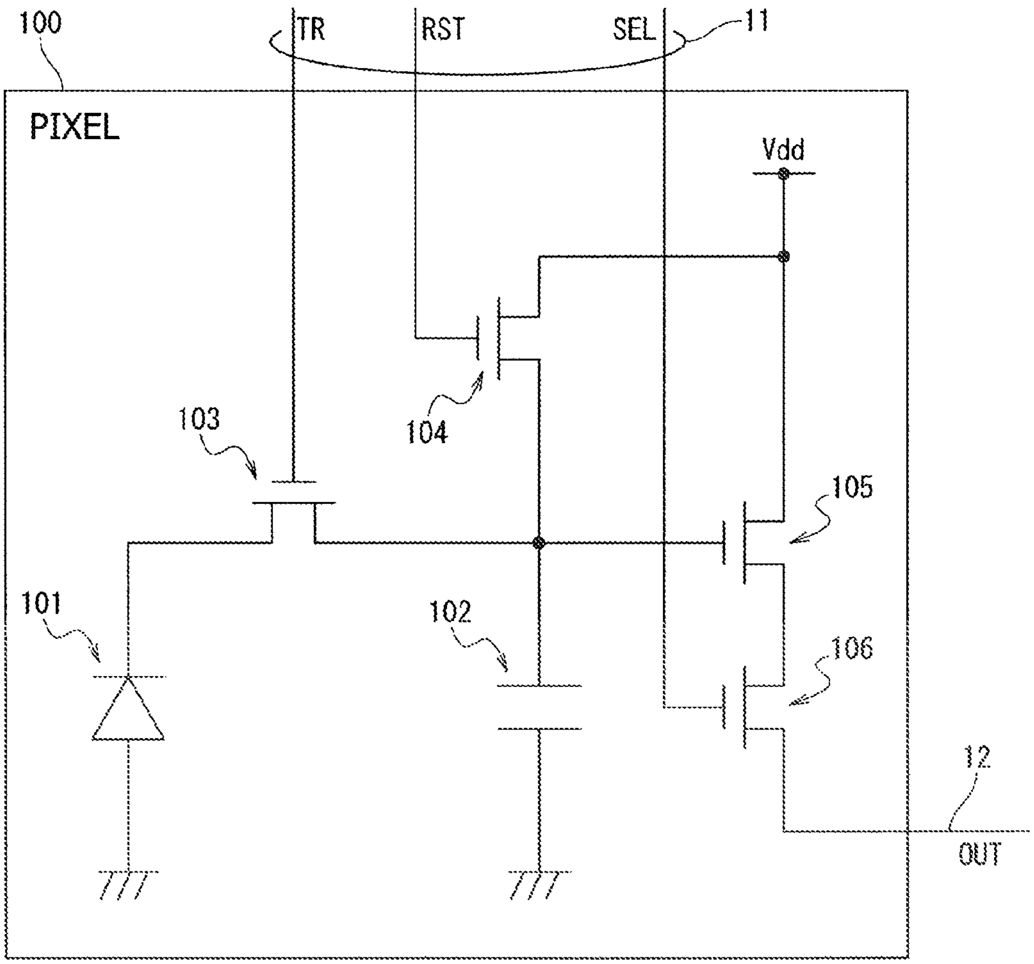
FIG. 2 is a circuit diagram depicting a configuration example of a pixel according to the first embodiment of the present technology.

FIG. 2 is a circuit diagram depicting a configuration example of a pixel according to the first embodiment of the present technology. The pixel 100 depicted in FIG. 2 includes a photoelectric conversion element 101, an electric-charge retaining section 102, and MOS transistors 103 to 106. The anode of the photoelectric conversion element 101 is grounded. The cathode of the photoelectric conversion element 101 is connected to the source of the MOS transistor 103.

The drain of the MOS transistor 103 is connected to the source of the MOS transistor 104, the gate of the MOS transistor 105, and one end of the electric-charge retaining section 102. The other end of the electric-charge retaining section 102 is grounded.

The drain of the MOS transistor 105 and the drain of the MOS transistor 106 are both connected to a power source line Vdd. The source of the MOS transistor 105 is connected to the drain of the MOS transistor 106. The source of the MOS transistor 106 is connected to an output signal line OUT.

The gate of the MOS transistor 103, the gate of the MOS transistor 104, and the gate of the MOS transistor 106 are connected to a transfer signal line TR, a reset signal line RST, and a selection signal line SEL, respectively. It is to be noted that the signal line 11 includes the transfer signal line TR, the reset signal line RST, and the selection signal line SEL.

Further, the signal line 12 includes the output signal line OUT. The photoelectric conversion element 101 generates an electric charge according to applied light, as previously described. A photodiode can be used as the photoelectric conversion element 101. In addition, the pixel circuit includes the electric-charge retaining section 102 and the MOS transistors 103 to 106.

The MOS transistor 103 transfers an electric charge generated as a result of photoelectric conversion at the photoelectric conversion element 101, to the electric-charge retaining section 102. Transfer of an electric charge by the MOS transistor 103 is controlled by a signal transmitted through the transfer signal line TR.

The electric-charge retaining section 102 is a capacitor that retains the electric charge transferred by the MOS transistor 103. The MOS transistor 105 generates a signal based on the electric charge retained in the electric-charge retaining section 102.

The MOS transistor 106 outputs, as an image signal, the signal generated by the MOS transistor 105 to the output signal line OUT. The MOS transistor 106 is controlled by a signal transmitted through the selection signal line SEL. The MOS transistor 104 resets the electric-charge retaining section 102 by discharging the electric charge retained in the electric-charge retaining section 102 to the power source line Vdd.

Reset to be performed by the MOS transistor 104 is controlled by a signal transmitted through the reset signal line RST, and is performed prior to transfer of an electric charge by the MOS transistor 103. It is to be noted that, when the reset is performed, a current may be caused to flow through the MOS transistor 103, so that the photoelectric conversion element 101 also can be reset. In such a manner, the pixel circuit converts an electric charge generated by the photoelectric conversion element 101 into an image signal.

(Sectional Structure of Optical Detector)

Figure 3:
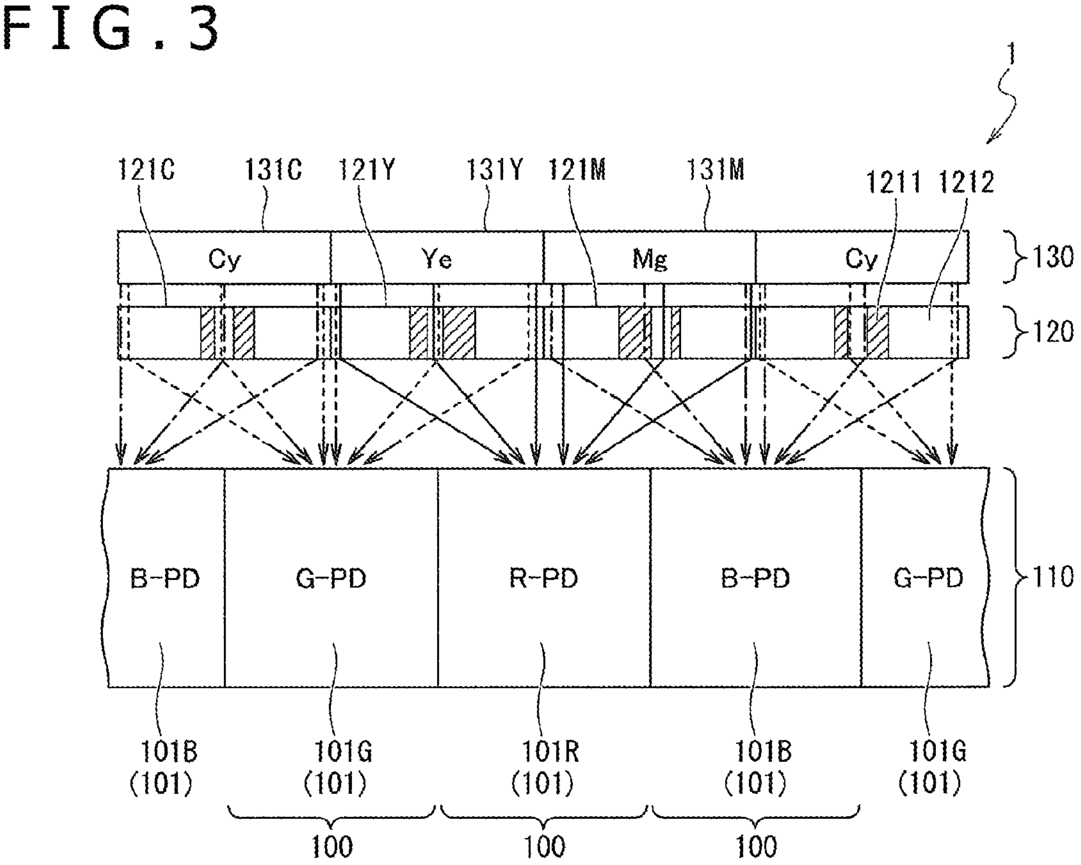
FIG. 3 is a partial longitudinal cross section view of one example of a semiconductor structure of the optical detector according to the first embodiment of the present technology.

FIG. 3 is a partial longitudinal cross section view of one example of a semiconductor structure of the optical detector 1 according to the first embodiment of the present technology. As depicted in FIG. 3, the optical detector 1 roughly includes a photoelectric conversion layer 110, a metasurface layer 120, and a filter layer 130, for example. An on-chip lens (not depicted) is disposed on the filter layer 130. The on-chip lens is an optical lens for efficiently condensing light that is incident on the optical detector 1 from the outside and for forming an image on the pixels 100 (i.e., photoelectric conversion element 101) in the photoelectric conversion layer 110.

Further, a wiring layer is disposed under the photoelectric conversion layer 110. On the wiring layer, a metal wiring pattern for transmitting power and any driving signal to the pixels 100 in the photoelectric conversion layer 110, and further, transmitting pixel signals read from the pixels 100, is formed. The wiring layer is formed on a semiconductor support substrate (not depicted). The semiconductor support substrate is provided for supporting layers that are formed during a semiconductor production process. In addition, for example, a logic circuit for implementing some of the abovementioned components is formed on the semiconductor support substrate.

The photoelectric conversion layer 110 is a functional layer in which a pixel circuit group including the photoelectric conversion elements 101 such as photodiodes constituting the respective pixels 100 and various electronic elements such as transistors is formed. The photoelectric conversion elements 101 in the photoelectric conversion layer 110 generate the quantity of electric charges according to the intensity of incident light having passed through the on-chip lens and the filter layer 130, convert the electric charges into electric signals, and output the generated signals as pixel signals. The photoelectric conversion elements 101 and the various electronic elements are electrically connected to predetermined metal wires in the wiring layer 22. In addition, a pixel separation unit (not depicted) for separating the pixels 100 from one another can be formed in the photoelectric conversion layer 110. For example, the pixel separation unit includes a trench structure that is formed by etching. The pixel separation unit inhibits the light incident on a certain pixel 100 from entering the adjacent pixels 100.

In FIG. 3, a red photoelectric conversion element 101, a blue photoelectric conversion element 101, and a green photoelectric conversion element 101 are schematically denoted by "101R," "101B," and "101G," respectively. It is to be noted that the array pattern of the photoelectric conversion elements 101R, 101G, and 101B is not limited to that depicted in FIG. 3. A variety of array patterns can be used therefor.

The filter layer 130 includes a plurality of complementary color filters 131C, 131Y, and 131M that selectively allow passage of light of predetermined wavelengths of the light condensed onto the on-chip lens. In the present embodiment, the cyan complementary color filter 131C, the yellow complementary color filter 131Y, and the magenta complementary color filter 131M are used. However, any other color complementary color filter may be used. The complementary color filter 131C, 131Y, or 131M which corresponds to any one of the colors (wavelengths) is disposed for each of the pixels 100.

The metasurface layer 120 includes a metasurface element 121C that guides blue light (indicated by an alternate long and short dash line in FIG. 3) having passed through the complementary color filter 131C in the filter layer 130 toward the photoelectric conversion element 101B, and guides green light (indicated by a dashed line in FIG. 3) having passed through the complementary color filter 131C toward the photoelectric conversion element 101G. Further, the metasurface layer 120 includes a metasurface element 121Y that guides red light (indicated by a solid line in FIG. 3) having passed through the complementary color filter 131Y toward the photoelectric conversion element 101R, and guides green light having passed through the complementary color filter 131Y toward the photoelectric conversion element 101G. Moreover, the metasurface layer 120 includes a metasurface element 121M that guides red light having passed through the complementary color filter 131M toward the photoelectric conversion element 101R, and guides blue light having passed through the complementary color filter 131M toward the photoelectric conversion element 101B.

In a case where the width of each pixel 100 is regarded as one cycle, the metasurface element 121C and the complementary color filter 131C are deviated from the corresponding photoelectric conversion elements 101G and 101B by half cycle, for example. Also, the metasurface element 121Y and the complementary color filter 131Y are deviated from the corresponding photoelectric conversion elements 101R and 101G by half cycle, for example. The metasurface element 121M and the complementary color filter 131M are deviated from the corresponding photoelectric conversion elements 101R and 101B by half cycle, for example.

Figure 4A:
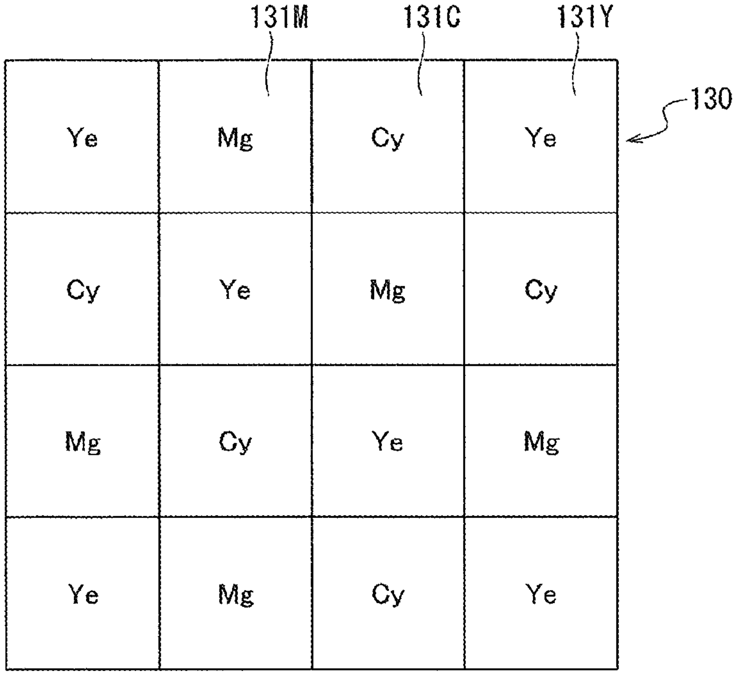
FIG. 4A is a plan view of a filter layer according to the first embodiment.

FIG. 4A illustrates the filter layer 130 in a plan view. As depicted in FIG. 4A, a plurality of the complementary color filters 131C, 131Y, and 131M are arranged in a matrix shape. In FIG. 4A, the cyan complementary color filter 131C, the yellow complementary color filter 131Y, and the magenta complementary color filter 131M are schematically denoted by "Cy," "Ye," and "Mg," respectively.

Figure 4B:
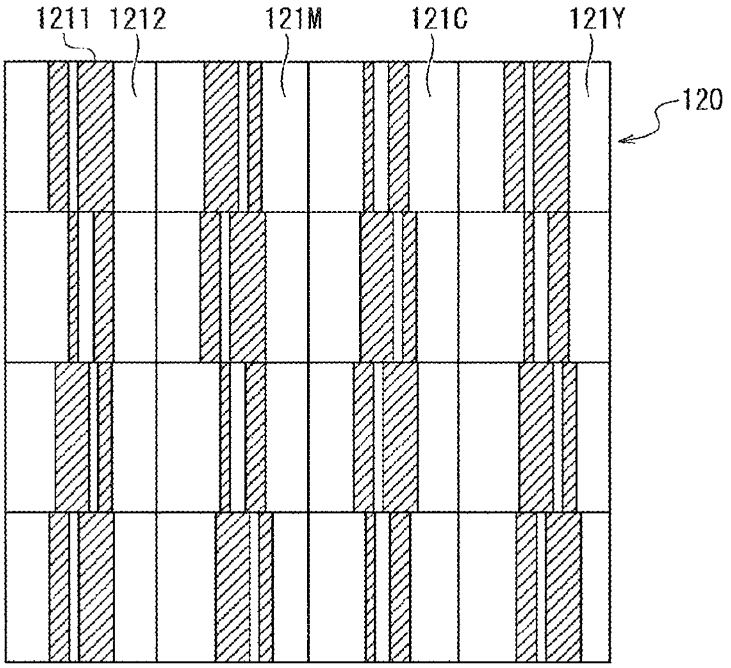
FIG. 4B is a plan view of a metasurface layer according to the first embodiment.

FIG. 4B illustrates the metasurface layer 120 in a plan view. As depicted in FIG. 4B, a plurality of the metasurface elements 121C, 121Y, and 121M are arranged in a matrix shape. Each of the plurality of the metasurface elements 121C, 121Y, and 121M includes a plurality of high-refractive index materials 1211 and low-refractive index materials 1212. It is to be noted that the pitch between the plurality of high-refractive index materials 1211 is smaller than a target light wavelength. The target light may be near infrared light, or may be visible light. The widths of the high-refractive index materials 1211 and the low-refractive index materials 1212 vary according to the wavelengths (colors). Also, in one example, the high-refractive index materials 1211 and the low-refractive index materials 1212 are formed into line shapes. It is to be noted that, for example, silicon nitride (Si3N4), titanium oxide (Ti2O), or the like is used as the high-refractive index material 1211. Silicon oxide (Si2O) or the like is used as the low-refractive index material 1212. In addition, in FIG. 4B, the right one of the high-refractive index materials 1211 is wider in the metasurface element 121C, the right one of the high-refractive index materials 1211 is wider in the metasurface element 121Y, and the left one of the high-refractive index materials 1211 is wider in the metasurface element 121M.

Figure 4C:
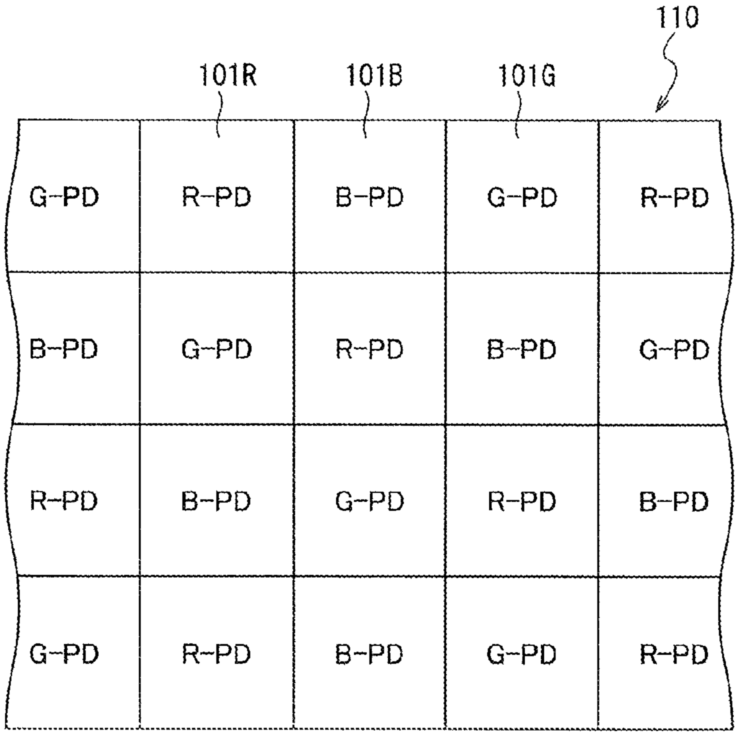
FIG. 4C is a plan view of a photoelectric conversion layer according to the first embodiment.

FIG. 4C illustrates the photoelectric conversion layer 110 in a plan view. As depicted in FIG. 4C, a plurality of the photoelectric conversion elements 101R, 101G, and 101B are arranged in a matrix shape. In FIG. 4C, the red photoelectric conversion element 101R, the green photoelectric conversion element 101G, and the blue photoelectric conversion element 101B are schematically denoted by "R-PD," "G-PD," and "B-PD," respectively.

Figure 5:
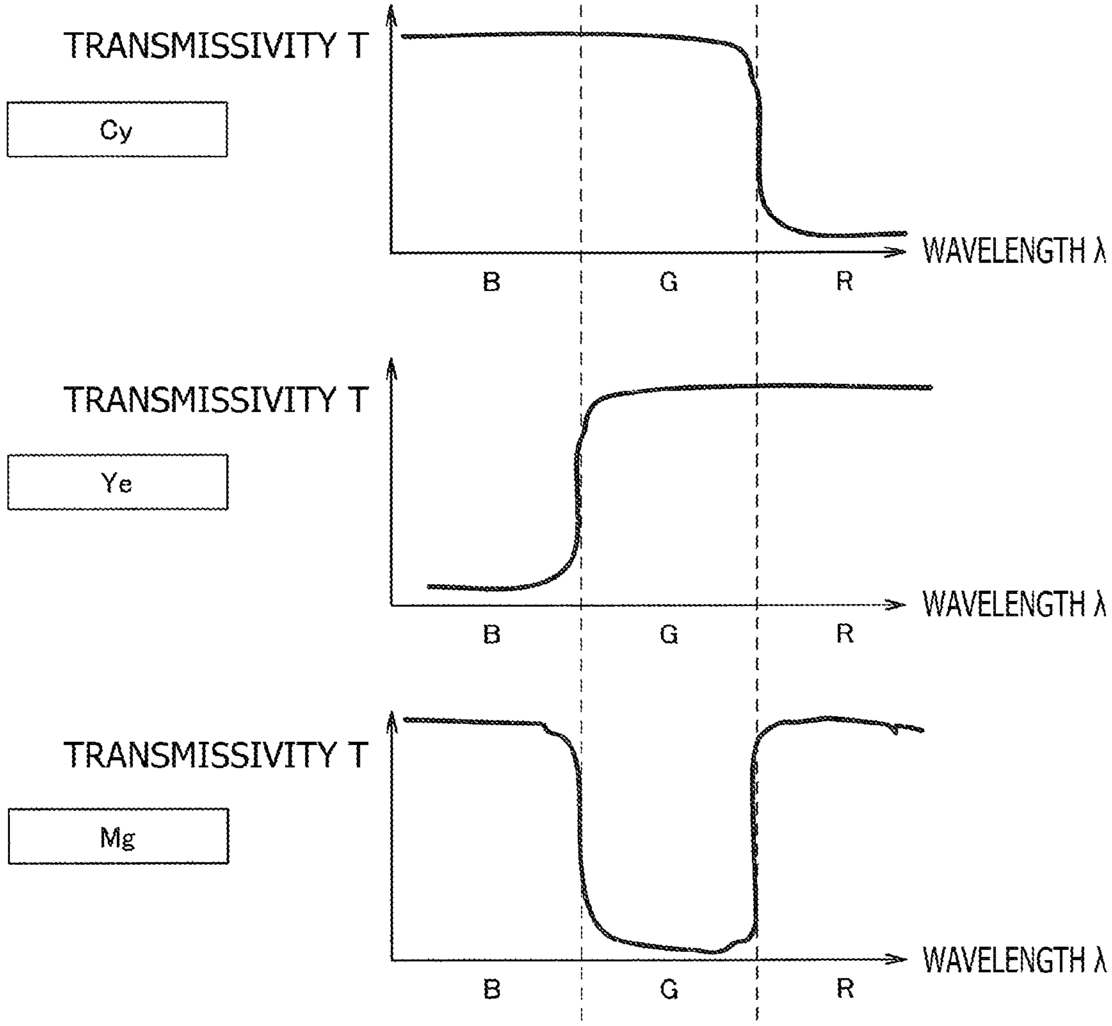
FIG. 5 is a diagram indicating transmission spectral characteristics of complementary color filters.

FIG. 5 indicates transmission spectral characteristics of the complementary color filters 131C, 131Y, and 131M. In FIG. 5, the vertical axis indicates transmissivity, and the horizontal axis indicates a wavelength. The cyan complementary color filter 131C allows blue light and green light to pass therethrough, but blocks red light.

The yellow complementary color filter 131Y allows red light and green light to pass therethrough, but blocks blue light. The magenta complementary color filter 131M allows red light and blue light to pass therethrough, but blocks green light.

Figure 6:
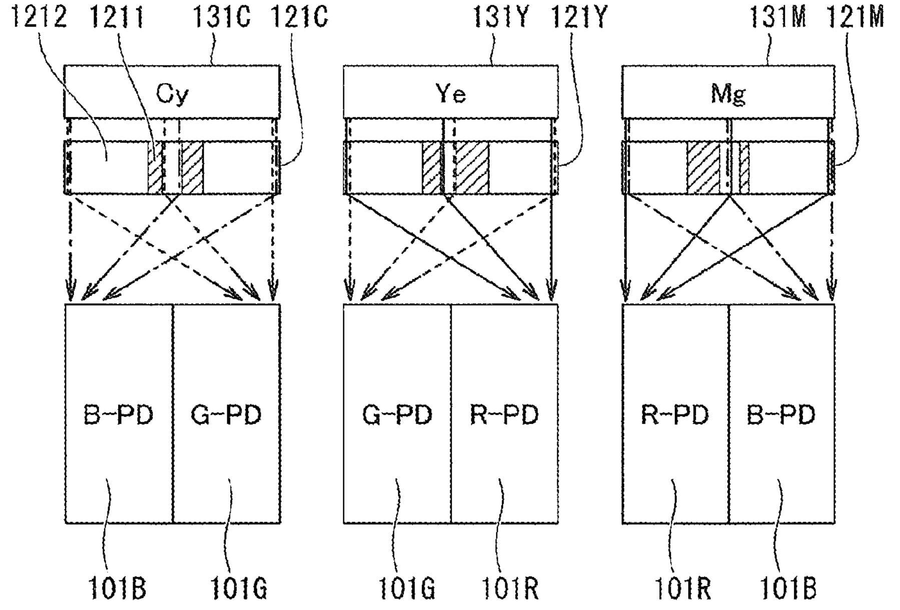
FIG. 6 is a diagram indicating that light is concentrated onto corresponding photoelectric conversion elements by a combination of complementary color filters and metasurface elements.

FIG. 6 indicates that light is concentrated onto each photoelectric conversion element 101 by a combination of the complementary color filters 131C, 131Y, and 131M and the metasurface elements 121C, 121Y, and 121M.

Incident light having entered an incident surface of each pixel 100 from the outside is condensed onto the on-chip lens. Further, blue light (indicated by an alternate long and short dash line in FIG. 6) of the incident light passes through the complementary color filter 131C, and then, arrives at the blue photoelectric conversion element 101B through the metasurface element 121C. A green component (indicated by a dashed line in FIG. 6) of the incident light passes through the complementary color filter 131C, and then, arrives at the green photoelectric conversion element 101G through the metasurface element 121C.

Further, a green component of the incident light passes through the complementary color filter 131Y, and then, arrives at the green photoelectric conversion element 101G through the metasurface element 121Y. A red component (indicated by a solid line in FIG. 6) of the incident light passes through the complementary color filter 131Y, and then, arrives at the red photoelectric conversion element 101R through the metasurface element 121Y.

Further, a red component of the incident light passes through the complementary color filter 131M, and then, arrives at the red photoelectric conversion element 101R through the metasurface element 121M. A blue component of the incident light passes through the complementary color filter 131M, and then, arrives at the blue photoelectric conversion element 101B through the metasurface element 121M.

Unlike a conventional splitter which separates light by three colors of RGB, the optical detector 1 having the abovementioned configuration separates light into two colors. Therefore, it is easy to design the metasurface elements 121C, 121Y, and 121M. Further, the sensitivity of the optical detector 1 can be increased to two times of the sensitivity of a primary-color filter structure.

Effects Provided by First Embodiment

According to the first embodiment, the metasurface elements 121C, 121Y, and 121M are disposed under the complementary color filters 131C, 131Y, and 131M, and the metasurface elements 121C, 121Y, and 121M separate light into RGB components to be concentrated onto the photoelectric conversion elements 101R, 101G, and 101B, respectively, in the abovementioned manner. Thus, it is easy to design the metasurface elements 121C, 121Y, and 121M since light is separated into two colors in the first embodiment while a conventional splitter separates light into three colors of RGB. In addition, the crosstalk can be suppressed, and noise of a color computation can be suppressed. Furthermore, good color reproduction property can be attained.

In addition, according to the first embodiment, the complementary color filter 131C and the metasurface element 121C are deviated from the corresponding blue photoelectric conversion element 101B and the corresponding green photoelectric conversion element 101G by half cycle, for example. Accordingly, only blue light can be concentrated onto the blue photoelectric conversion element 101B while only green light can be concentrated onto the green photoelectric conversion element 101G.

Second Embodiment

Figure 7:
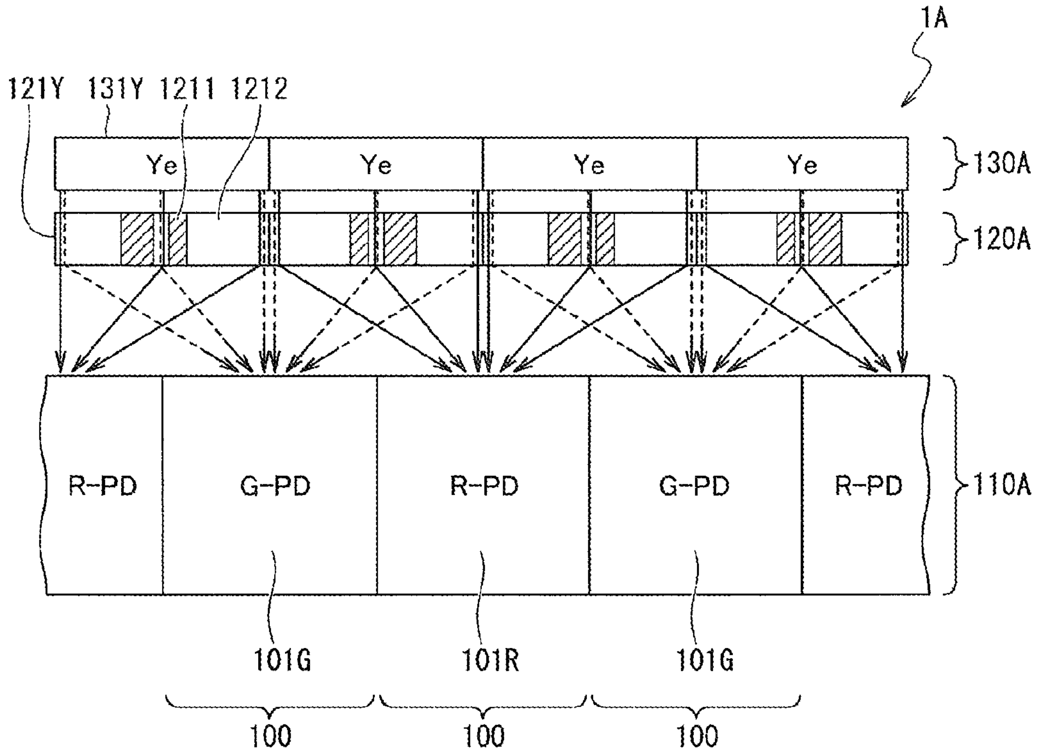
FIG. 7 is a partial longitudinal cross section view (I) of one example of a semiconductor structure of an optical detector according to a second embodiment of the present technology.
Figure 8:
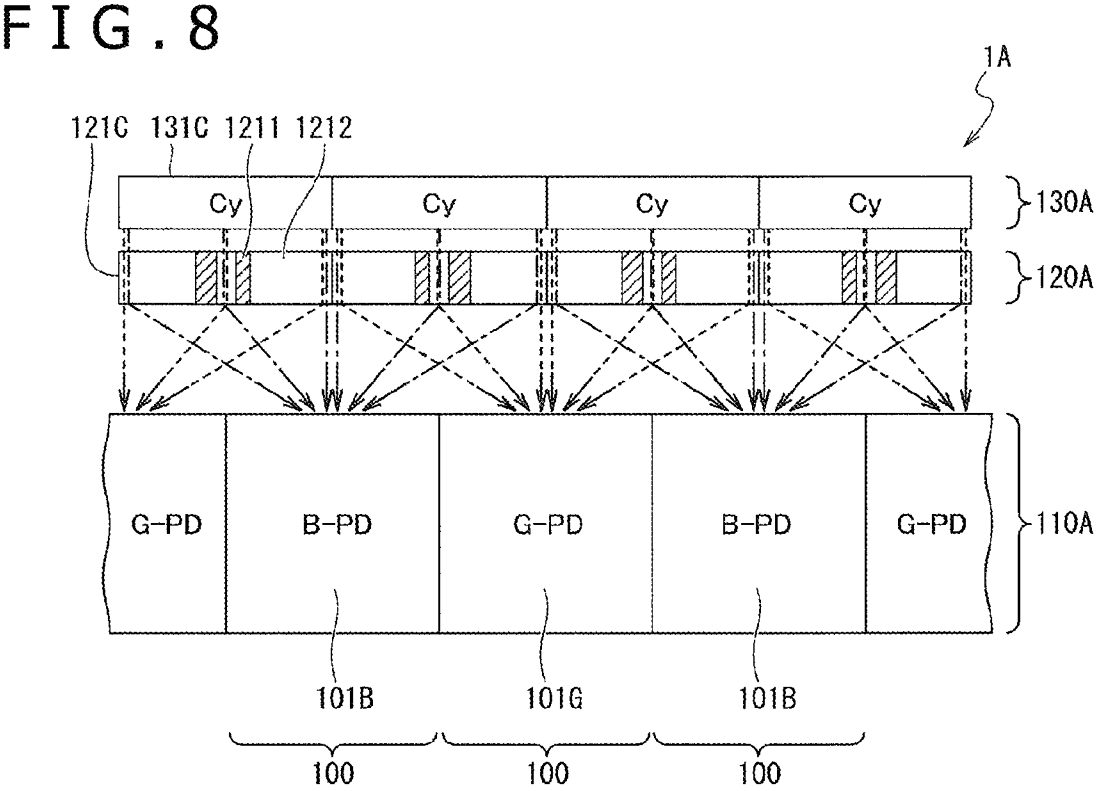
FIG. 8 is a partial longitudinal cross section view (II) of one example of the semiconductor structure of the optical detector according to the second embodiment of the present technology.

FIG. 7 and FIG. 8 are partial longitudinal cross section views of one example of a semiconductor structure of an optical detector 1A according to a second embodiment of the present technology. In FIG. 7 and FIG. 8, a component identical to that in FIG. 3 is denoted by the same reference sign, and a detailed explanation thereof will be omitted.

The optical detector 1A roughly includes a photoelectric conversion layer 110A, a metasurface layer 120A, and a filter layer 130A, for example. In FIG. 7, the green photoelectric conversion elements 101G and the red photoelectric conversion elements 101R are alternately arranged in the photoelectric conversion layer 110A.

The filter layer 130A includes a plurality of complementary color filters 131Y that selectively allow light of specific wavelengths (green and red) in the light condensed on the on-chip lens to pass therethrough. The metasurface layer 120A includes the metasurface element 121Y that guides red light (indicated by a solid line in FIG. 7) having passed through the complementary color filter 131Y in the filter layer 130A toward the photoelectric conversion element 101R, and guides green light (indicated by a dashed line in FIG. 7) having passed through the complementary color filter 131Y toward the photoelectric conversion element 101G.

In FIG. 8, the green photoelectric conversion elements 101G and the blue photoelectric conversion elements 101B are alternately arranged in the photoelectric conversion layer 110A.

The filter layer 130A includes a plurality of complementary color filters 131C that selectively allow light of specific wavelengths (blue and green) in the light condensed on the on-chip lens to pass therethrough. The metasurface layer 120A includes the metasurface element 121C that guides green light (indicated by a dashed line in FIG. 8) having passed through the complementary color filter 131C in the filter layer 130A toward the photoelectric conversion element 101G, and guides blue light having passed through the complementary color filter 131C (indicated by an alternate long and short dash line in FIG. 8) toward the photoelectric conversion element 101B.

Figure 9A:
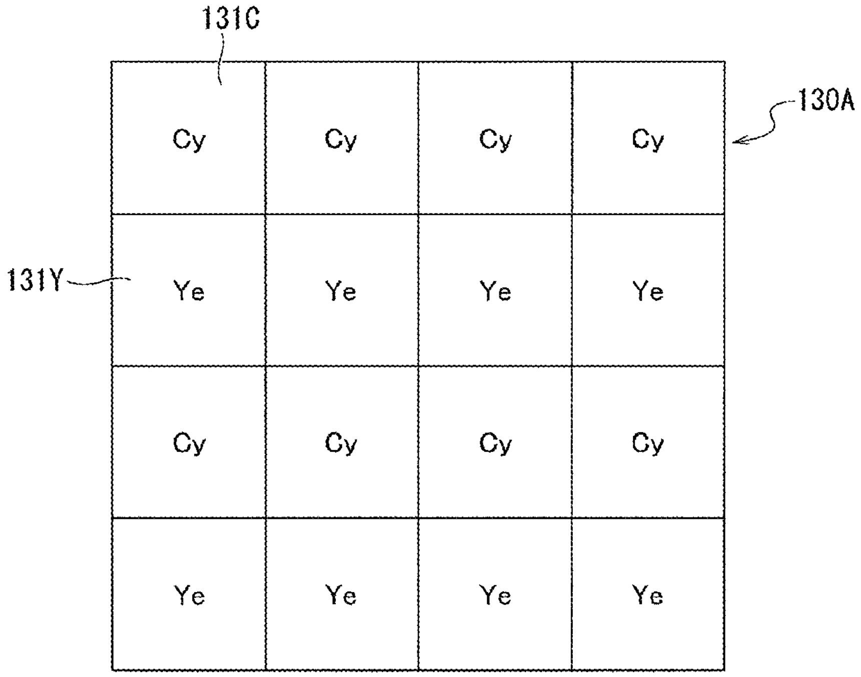
FIG. 9A is a plan view of a filter layer according to the second embodiment.

FIG. 9A illustrates the filter layer 130A in a plan view. As depicted in FIG. 9A, a Bayer array, in which a plurality of the complementary color filters 131C are arranged in one row and a plurality of complementary color filters 131Y are arranged in one row, is formed. In FIG. 9A, the cyan complementary color filter 131C and the yellow complementary color filter 131Y are schematically denoted by "Cy" and "Ye," respectively.

Figure 9B:
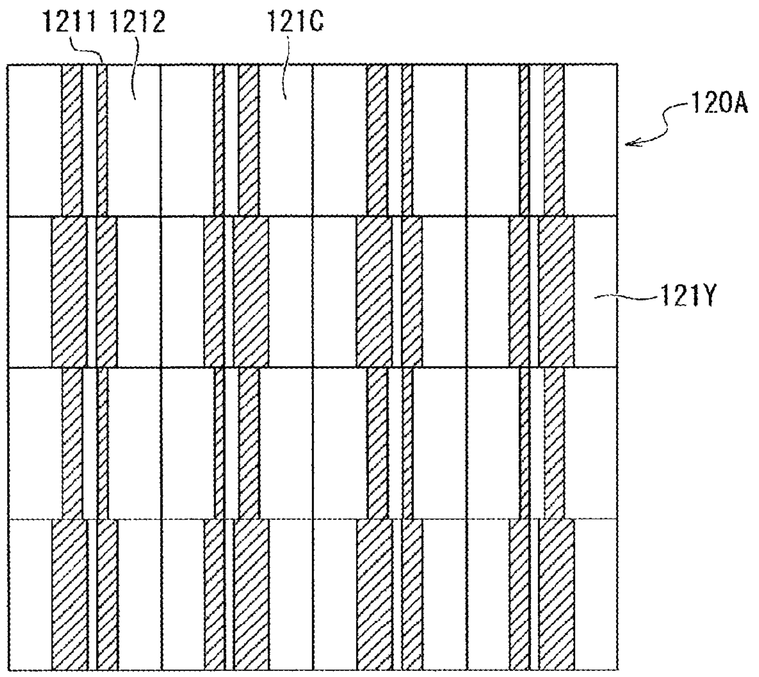
FIG. 9B is a plan view of a metasurface layer according to the second embodiment.

FIG. 9B illustrates the metasurface layer 120A in a plan view. As depicted in FIG. 9B, a plurality of the metasurface elements 121C and 121Y are arranged in a Bayer array. In each of the metasurface elements 121C in FIG. 9B, the left one of the high-refractive index materials 1211 is wider in the first row, and the right one of the high-refractive index materials 1211 is wider in the second row. Also, in each of the metasurface elements 121Y in FIG. 9B, the left one of the high-refractive index materials 1211 is wider in the first row, and the right one of the high-refractive index materials 1211 is wider in the second row.

Figure 9C:
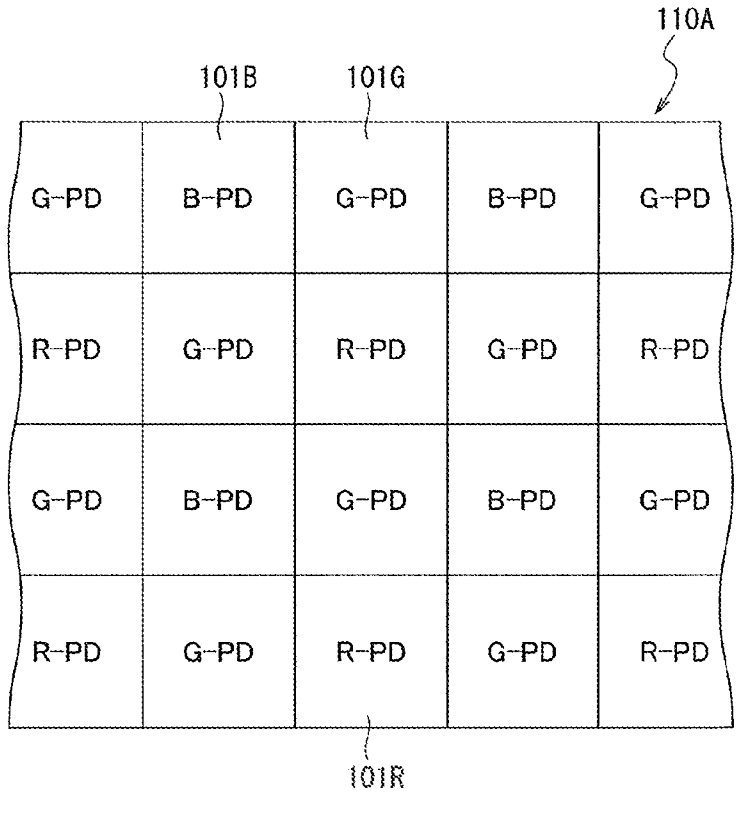
FIG. 9C is a plan view of a photoelectric conversion layer according to the second embodiment.

FIG. 9C illustrates the photoelectric conversion layer 110A in a plan view. As depicted in FIG. 9C, a plurality of the photoelectric conversion elements 101R, 101G, and 101B are arranged in a Bayer array. In FIG. 9C, the red photoelectric conversion element 101R, the green photoelectric conversion element 101G, and the blue photoelectric conversion element 101B are schematically denoted by "R-PD," "G-PD," and "B-PD," respectively.

Effects Provided by Second Embodiment

According to the second embodiment, the similar effect that is provided by the abovementioned first embodiment is provided, and further, the resolution of light of a common wavelength (green) that passes through the complementary color filters 131C and 131 can be enhanced.

Third Embodiment

Figure 10:
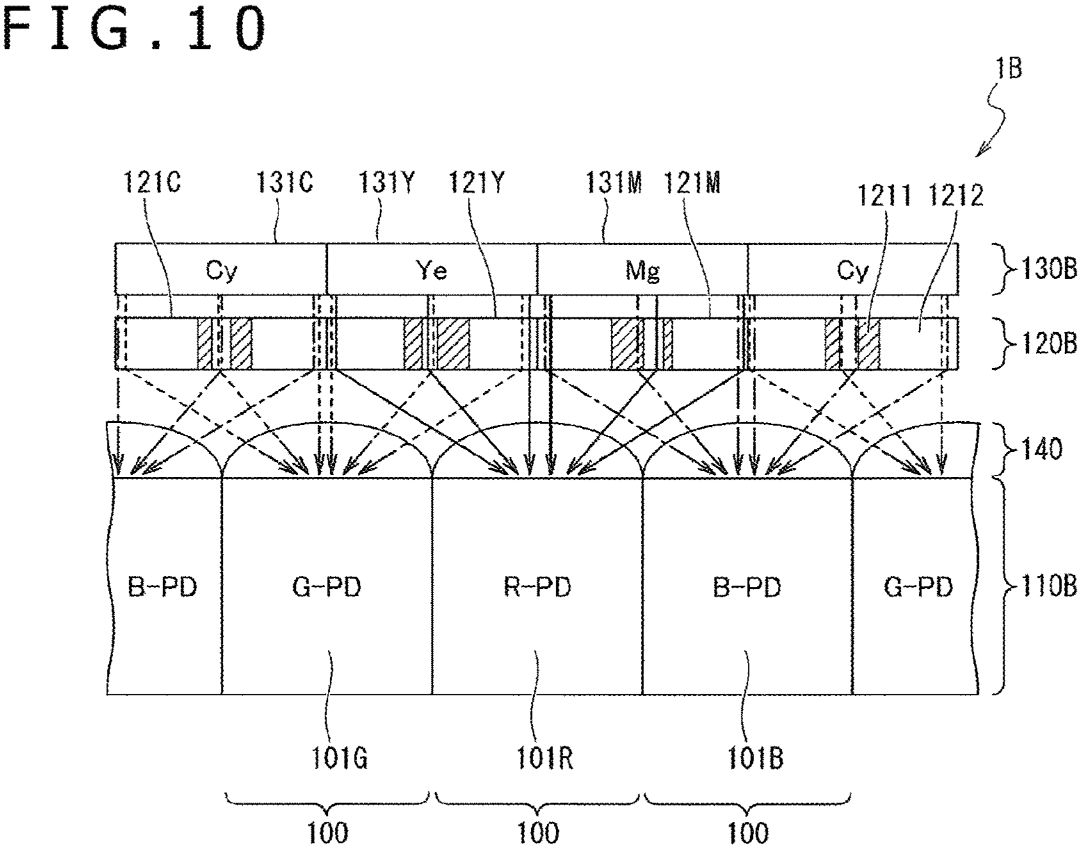
FIG. 10 is a partial longitudinal cross section view of one example of a semiconductor structure of an optical detector according to a third embodiment of the present technology.

FIG. 10 is a partial longitudinal cross section view of one example of a semiconductor structure of an optical detector 1B according to a third embodiment of the present technology. In FIG. 10, a component identical to that in FIG. 3 is denoted by the same reference sign, and a detailed explanation thereof will be omitted.

The optical detector 1B roughly includes a photoelectric conversion layer 110B, a metasurface layer 120B, and a filter layer 130B, for example. In FIG. 10, the green photoelectric conversion element 101G, the red photoelectric conversion element 101R, and the blue photoelectric conversion element 101B are formed in the photoelectric conversion layer 110B.

In the third embodiment of the present technology, on-chip lenses 140 respectively corresponding to the photoelectric conversion elements 101R, 101G, and 101B are included between the photoelectric conversion layer 110B and the metasurface layer 120B. Each on-chip lens 140 is an optical lens for efficiently condensing light having passed through the metasurface elements 121C, 121Y, and 121M and for forming an image on the pixels 100 (i.e., the photoelectric conversion elements 101R, 101G, and 101B) in the photoelectric conversion layer 110B. The on-chip lenses 140 are provided for respective pixels 100.

It is to be noted that the on-chip lenses 140 include silicon oxide, silicon nitride, silicon oxynitride, organic SOG, polyimide-based resin, or fluorine-based resin, for example.

Effects Provided by Third Embodiment

According to the third embodiment, the similar effect to that provided by the abovementioned first embodiment can be provided, and the sensitivity can be enhanced since the on-chip lenses 140 are disposed on the photoelectric conversion elements 101R, 101G, and 101B. Accordingly, color mixing is suppressed.

Modification of Third Embodiment

Figure 11:
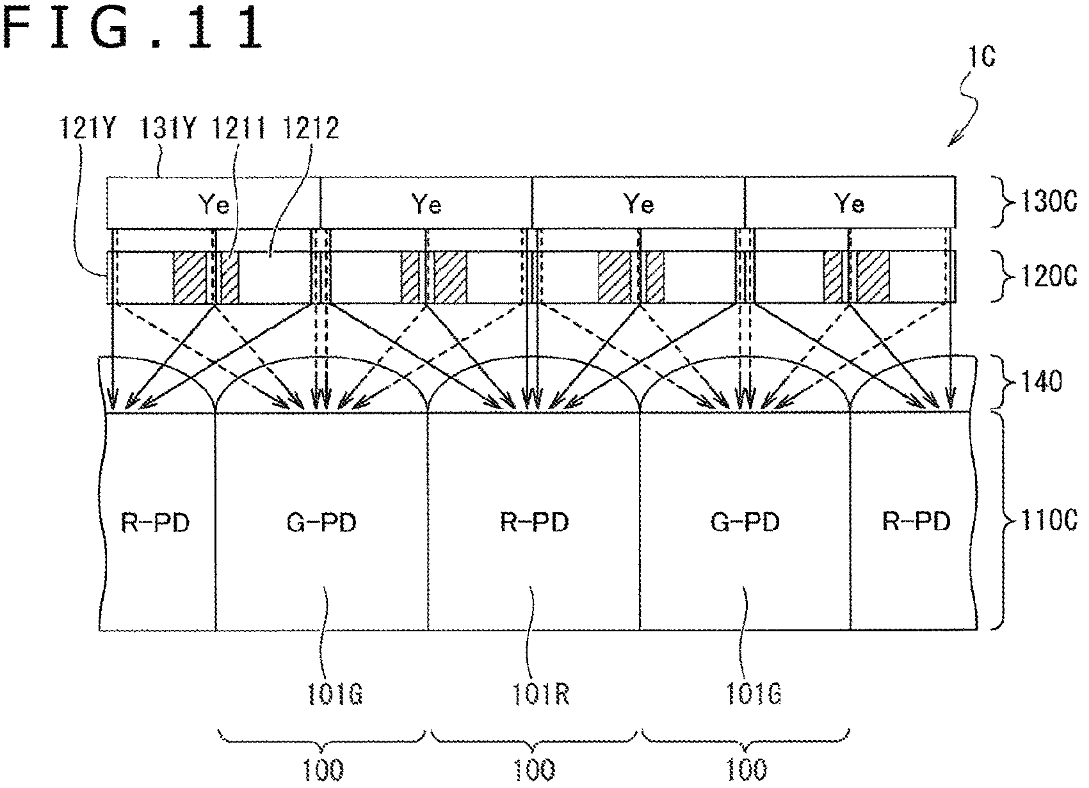
FIG. 11 is a partial longitudinal cross section view (I) of one example of a semiconductor structure of an optical detector according to a modification of the third embodiment of the present technology.
Figure 12:
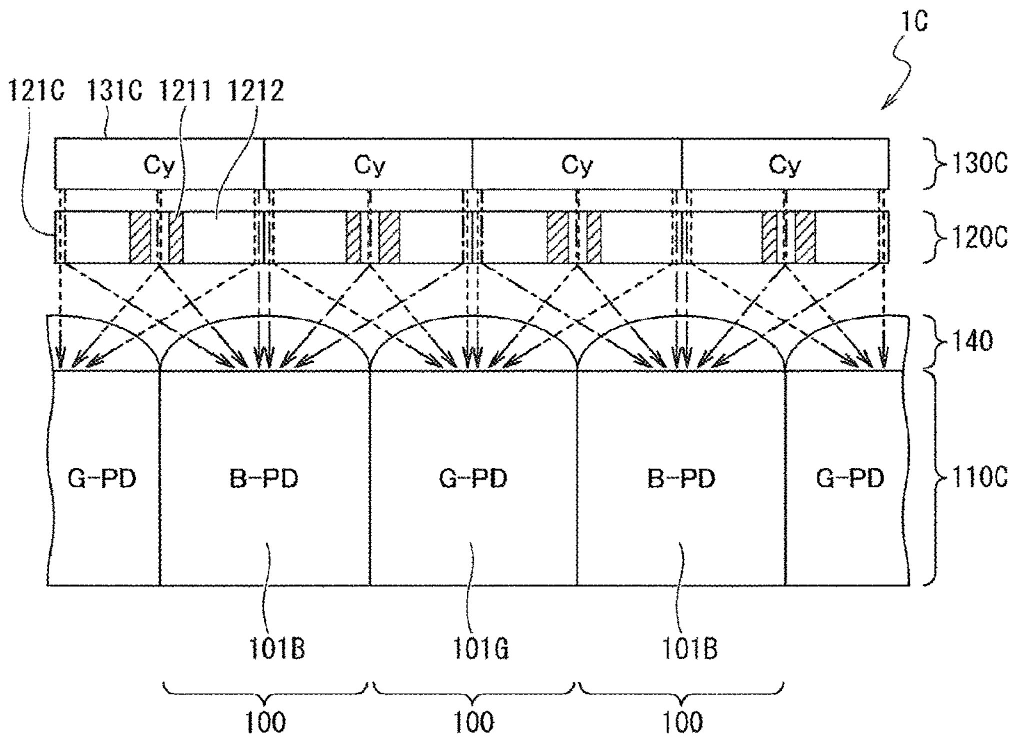
FIG. 12 is a partial longitudinal cross section view (II) of one example of the semiconductor structure of the optical detector according to the modification of the third embodiment of the present technology.

FIG. 11 and FIG. 12 are partial longitudinal cross section views of one example of a semiconductor structure of an optical detector 1C according to a modification of the third embodiment of the present technology. In FIG. 11 and FIG. 12, a component identical to that in FIG. 7 and FIG. 8 are denoted by the same reference sign, and a detailed explanation thereof will be omitted.

The optical detector 1C roughly includes a photoelectric conversion layer 110C, a metasurface layer 120C, and a filter layer 130C, for example. In the modification of the third embodiment of the present technology, the on-chip lenses 140 respectively corresponding to the photoelectric conversion elements 101R, 101G, and 101B are included between the photoelectric conversion layer 110C and the metasurface layer 120C.

In FIG. 11, the green photoelectric conversion elements 101G and the red photoelectric conversion elements 101R are alternately arranged in the photoelectric conversion layer 110C.

The filter layer 130C includes a plurality of the complementary color filters 131Y that selectively allow light of specific wavelengths (green and red) in light condensed onto an uppermost on-chip lens (not depicted) to pass therethrough. The metasurface layer 120C includes the metasurface element 121Y that guides red light (indicated by a solid line in FIG. 11) having passed through the complementary color filter 131Y in the filter layer 130C toward the photoelectric conversion element 101R, and guides green light (indicated by a dashed line in FIG. 11) having passed through the complementary color filter 131Y toward the photoelectric conversion element 101G.

In FIG. 12, the green photoelectric conversion elements 101G and the blue photoelectric conversion elements 101B are alternately arranged in the photoelectric conversion layer 110C.

The filter layer 130C includes a plurality of the complementary color filters 131C that selectively allow light of specific wavelengths (blue and green) in the light condensed onto the uppermost on-chip lens (not depicted) to pass therethrough. The metasurface layer 120C includes the metasurface element 121C that guides green light (indicated by a dashed line in FIG. 12) having passed through the complementary color filter 131C in the filter layer 130C toward the photoelectric conversion element 101G, and guides blue light (indicated by an alternate long and short dash line in FIG. 12) having passed through the complementary color filter 131C toward the photoelectric conversion element 101B.

Effects Provided by Modification of Third Embodiment

According to the modification of the third embodiment, the similar effect to that provided by the abovementioned second embodiment is provided, and further, the similar effect to that provided by the abovementioned third embodiment is provided.

Fourth Embodiment

Figure 13A:
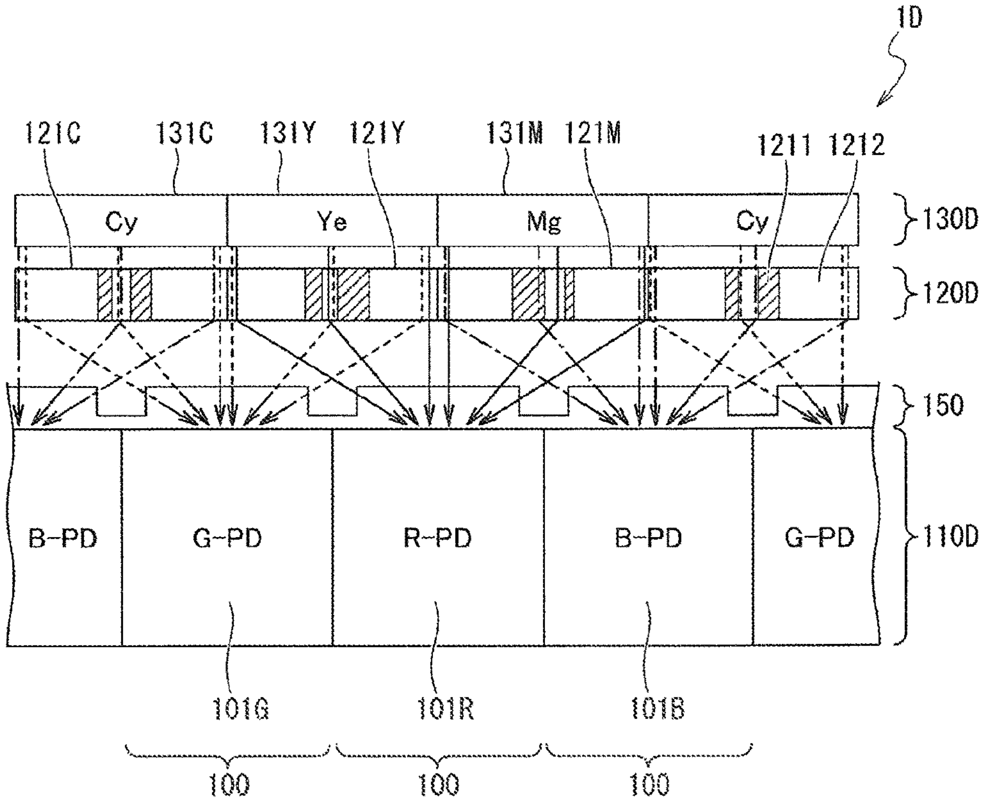
FIG. 13A is a partial longitudinal cross section view of one example of a semiconductor structure of an optical detector according to a fourth embodiment of the present technology.

FIG. 13A is a partial longitudinal cross section view of one example of a semiconductor structure of an optical detector 1D according to a fourth embodiment of the present technology. In FIG. 13A, a component identical to that in FIG. 3 is denoted by the same reference sign, and a detailed explanation thereof will be omitted.

The optical detector 1D roughly includes a photoelectric conversion layer 110D, a metasurface layer 120D, and a filter layer 130D, for example. In FIG. 13A, the green photoelectric conversion element 101G, the red photoelectric conversion element 101R, and the blue photoelectric conversion element 101B are formed in the photoelectric conversion layer 110D.

Figure 13B:
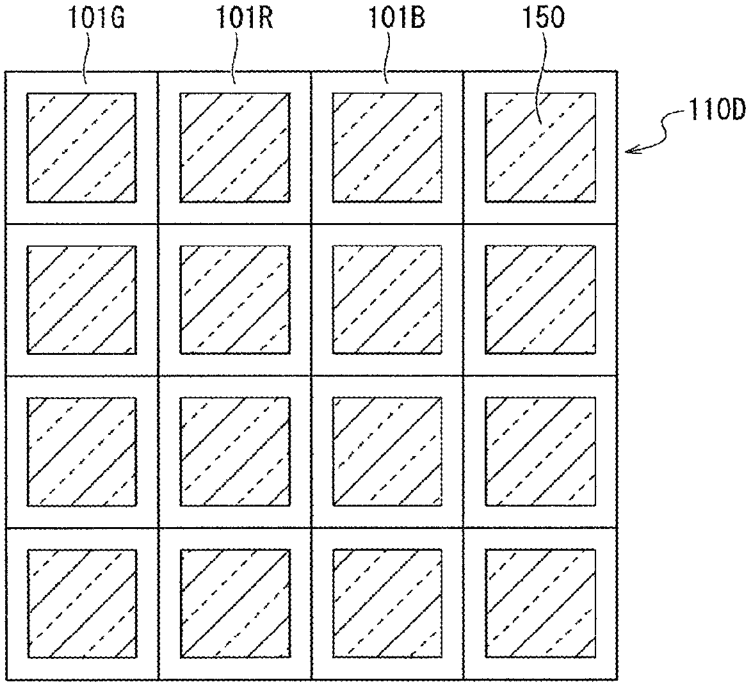
FIG. 13B is a plan view of an on-chip lens which is disposed on the upper surface of a photoelectric conversion element according to the fourth embodiment.

In the fourth embodiment of the present technology, quadrangular pillar on-chip lenses 150 respectively corresponding to the photoelectric conversion elements 101R, 101G, and 101B are included between the photoelectric conversion layer 110D and the metasurface layer 120D. When viewed from above, the quadrangular pillar on-chip lenses 150 are disposed on the upper surfaces (rear surfaces) of the corresponding photoelectric conversion elements 101R, 101G, and 101B, as depicted in FIG. 13B. Each of the on-chip lenses 150 is an optical lens for efficiently condensing light that has passed through the metasurface elements 121C, 121Y, and 121M and for forming an image on the pixels 100 (i.e., the photoelectric conversion elements 101R, 101G, and 101B) in the photoelectric conversion layer 110D. The on-chip lenses 150 are provided for respective pixels 100.

It is to be noted that the on-chip lenses 150 include silicon oxide, silicon nitride, silicon oxynitride, organic SOG, polyimide-based resin, or fluorine-based resin, for example. The shape of each on-chip lens 150 may be a quadrangular pillar, a polygon, or a round pillar.

Effects Provided by Fourth Embodiment

According to the fourth embodiment, the similar effect to that provided by the abovementioned third embodiment is provided.

Modification of Fourth Embodiment

Figure 14:
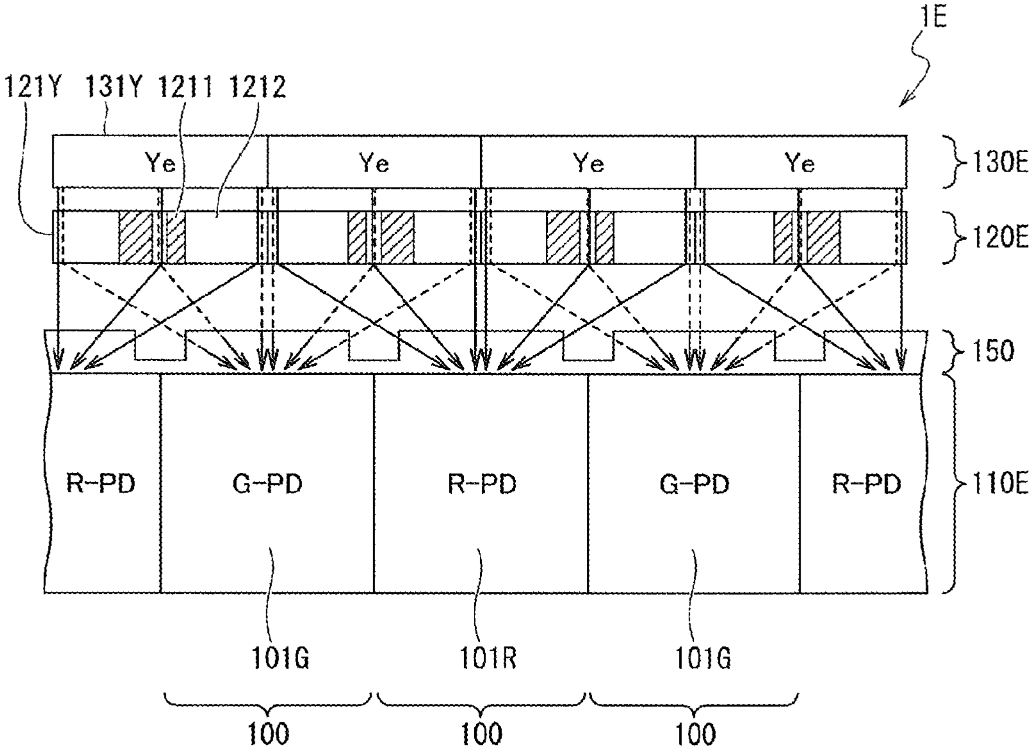
FIG. 14 is a partial longitudinal cross section view (I) of one example of a semiconductor structure of an optical detector according to a modification of the fourth embodiment of the present technology.
Figure 15:
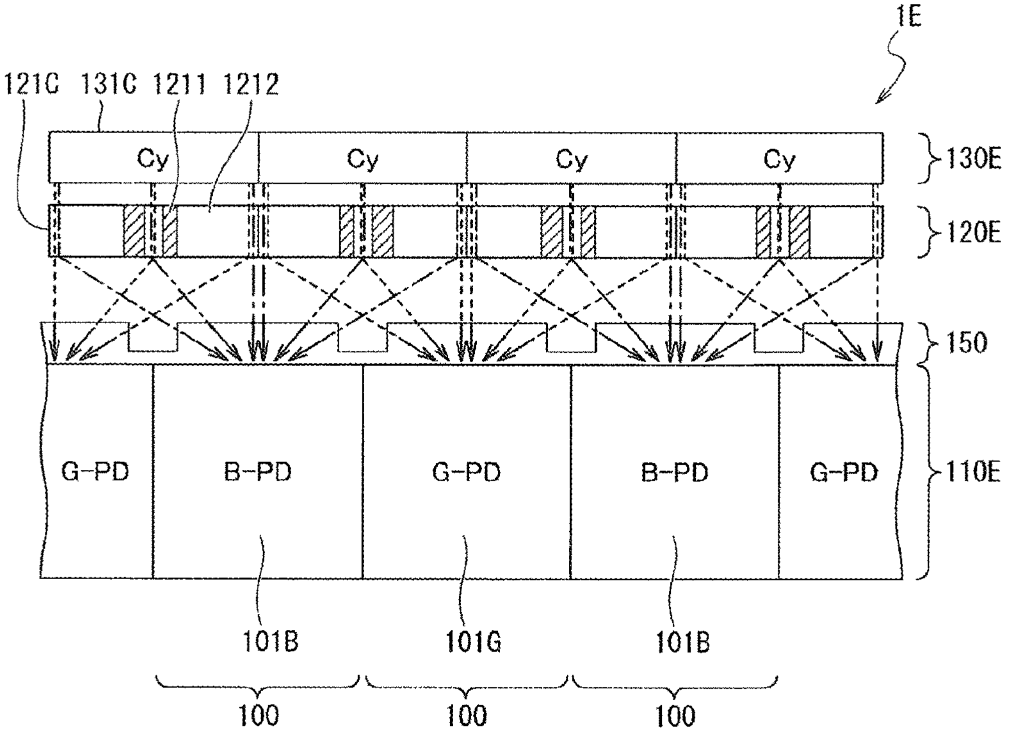
FIG. 15 is a partial longitudinal cross section view (II) of one example of the semiconductor structure of the optical detector according to the modification of the fourth embodiment of the present technology.

FIG. 14 and FIG. 15 are partial longitudinal cross section views of one example of a semiconductor structure of an optical detector 1E according to a modification of the fourth embodiment of the present technology. In FIG. 14 and FIG. 15, a component identical to that in FIG. 7 and FIG. 8 is denoted by the same reference sign, and a detailed explanation thereof will be omitted.

The optical detector 1E roughly includes a photoelectric conversion layer 110E, a metasurface layer 120E, and a filter layer 130E, for example. In the modification of the fourth embodiment of the present technology, the box-shaped on-chip lenses 150 respectively corresponding to the photoelectric conversion elements 101R, 101G, and 101B are included between the photoelectric conversion layer 110E and the metasurface layer 120E.

In FIG. 14, the green photoelectric conversion elements 101G and the red photoelectric conversion elements 101R are alternately arranged in the photoelectric conversion layer 110E.

The filter layer 130E includes a plurality of the complementary color filters 131Y that selectively allow light of specific wavelengths (green and red) in the light condensed by an uppermost on-chip lens (not depicted) to pass therethrough. The metasurface layer 120E includes the metasurface element 121Y that guides red light (indicated by a solid line in FIG. 14) having passed through the complementary color filter 131Y in the filter layer 130E toward the photoelectric conversion element 101R, and guides green light (indicated by a dashed line in FIG. 14) having passed through the complementary color filter 131Y toward the photoelectric conversion element 101G.

In FIG. 15, the green photoelectric conversion elements 101G and the blue photoelectric conversion elements 101B are alternately arranged in the photoelectric conversion layer 110E.

In FIG. 15, the filter layer 130E includes a plurality of the complementary color filters 131C that selectively allow light of specific wavelengths (blue and green) in the light condensed by the uppermost on-chip lens (not depicted) to pass therethrough. The metasurface layer 120E includes the metasurface element 121C that guides green light (indicated by a dashed line in FIG. 15) having passed through the complementary color filter 131C in the filter layer 130E toward the photoelectric conversion element 101G, and guides blue light (indicated by an alternate long and short dash line in FIG. 15) having passed through the complementary color filter 131C toward the photoelectric conversion element 101B.

Effects Provided by Modification of Fourth Embodiment

According to the modification of the fourth embodiment, the similar effect to that provided by the abovementioned modification of the third embodiment is provided.

Fifth Embodiment

Figure 16:
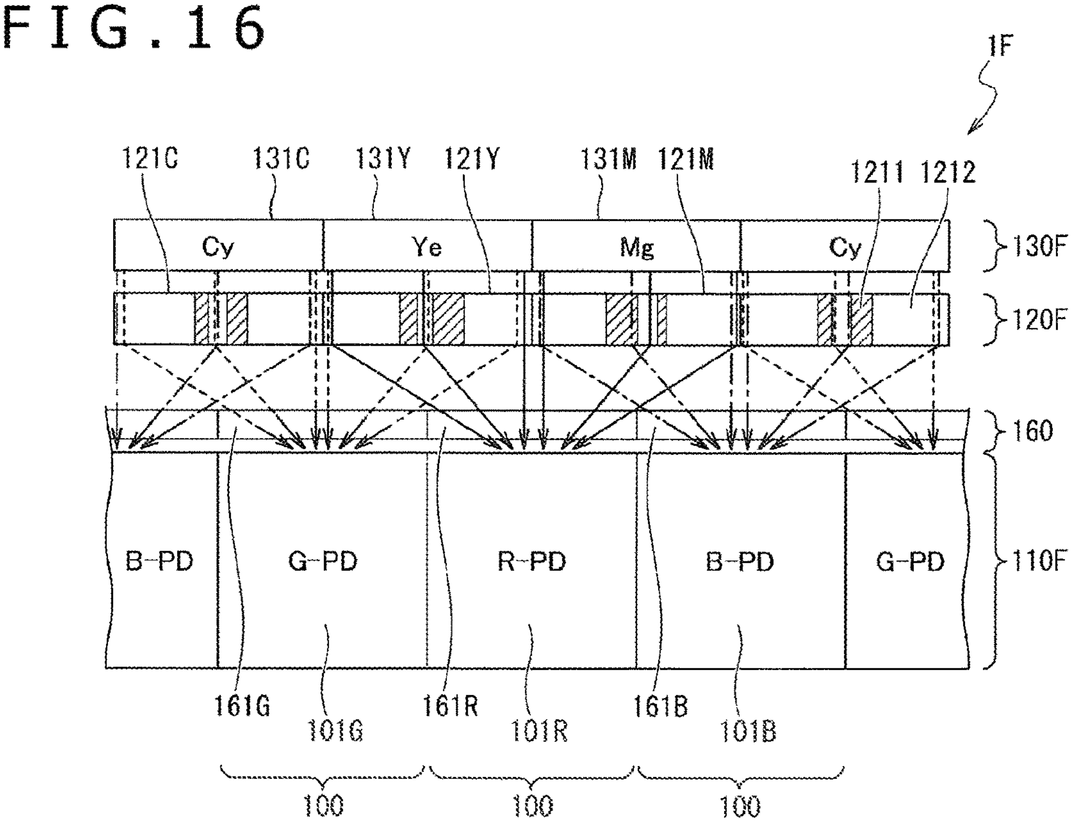
FIG. 16 is a partial longitudinal cross section view of one example of a semiconductor structure of an optical detector according to a fifth embodiment of the present technology.

FIG. 16 is a partial longitudinal cross section view of one example of a semiconductor structure of an optical detector 1F according to a fifth embodiment of the present technology. In FIG. 16, a component identical to that in FIG. 3 is denoted by the same reference sign, and a detailed explanation thereof will be omitted.

The optical detector 1F roughly includes a photoelectric conversion layer 110F, a metasurface layer 120F, and a filter layer 130F, for example. In FIG. 16, the green photoelectric conversion element 101G, the red photoelectric conversion element 101R, and the blue photoelectric conversion element 101B are formed in the photoelectric conversion layer 110F.

In the fifth embodiment of the present technology, primary color filters 160 respectively corresponding to the photoelectric conversion elements 101R, 101G, and 101B are included between the photoelectric conversion layer 110F and the metasurface layer 120F. Each of the primary color filters 160 is an optical filter that selectively allows light of a specific wavelength in light that has undergone the light separation at the metasurface element 121C, 121Y, or 121M to pass therethrough. In the present embodiment, four primary color filters 161R, 161G, and 161B that selectively allow respective wavelengths of red light, green light, and blue light to pass therethrough, respectively. However, the primary color filters 160 are not limited to these filters. The primary color filters 160, each of which corresponds to any one of these colors (wavelengths), are provided for respective pixels 100.

Effects Provided by Fifth Embodiment

According to the fifth embodiment, the similar effect to that provided by the abovementioned first embodiment is provided, and the primary color filters 161R, 161G, and 161B are respectively disposed on the photoelectric conversion elements 101R, 101G, and 101B, so that color mixing can be suppressed and the color reproduction property can be enhanced.

Modification of Fifth Embodiment

Figure 17:
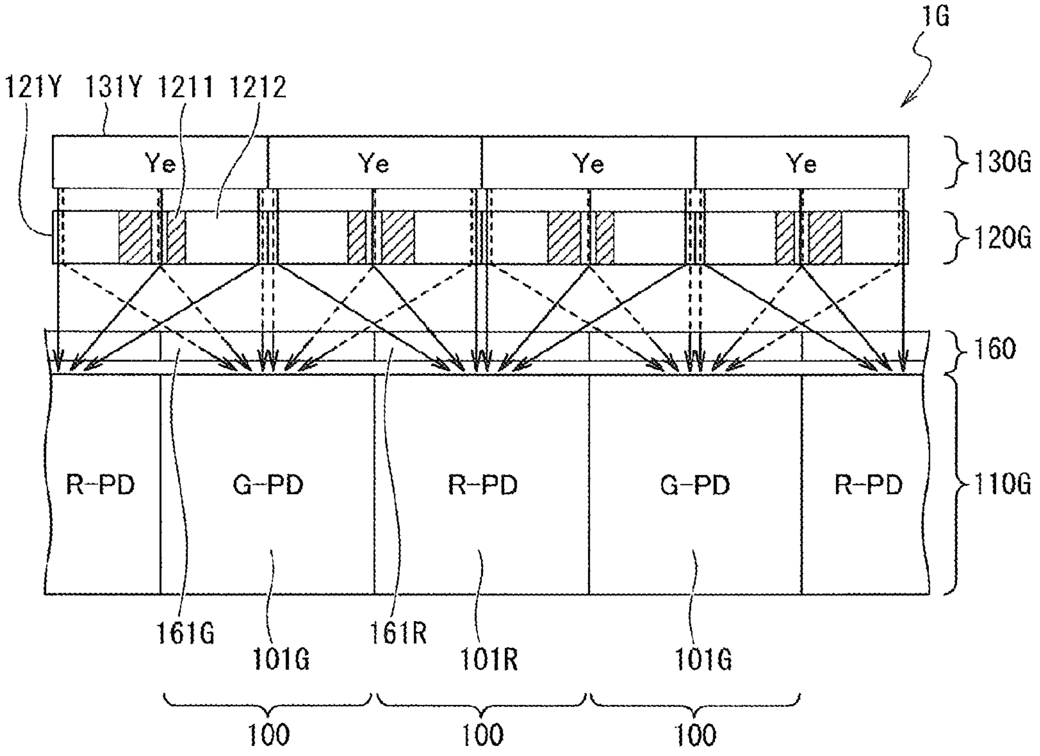
FIG. 17 is a partial longitudinal cross section view (I) of one example of a semiconductor structure of an optical detector according to a modification of the fifth embodiment of the present technology.
Figure 18:
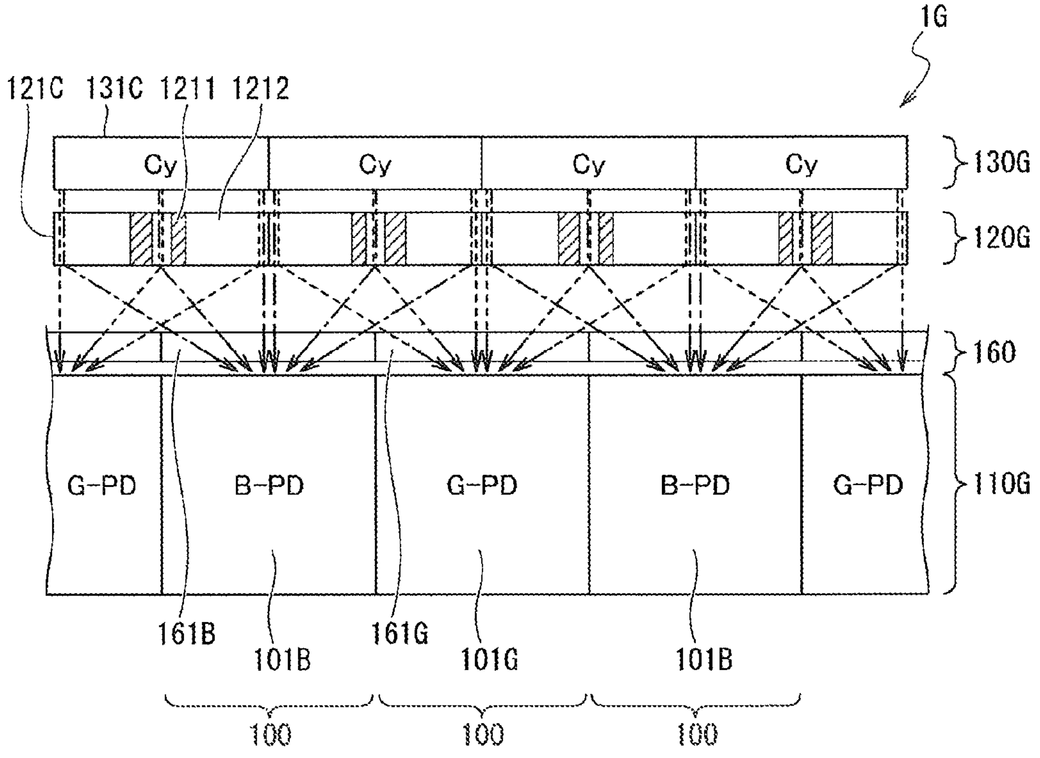
FIG. 18 is a partial longitudinal cross section view (II) of one example of the semiconductor structure of the optical detector according to the modification of the fifth embodiment of the present technology.

FIG. 17 and FIG. 18 are partial longitudinal cross section views of one example of a semiconductor structure of an optical detector 1G according to a modification of the fifth embodiment of the present technology. In FIG. 17 and FIG. 18, a component identical to that in FIG. 7 and FIG. 8 is denoted by the same reference sign, and a detailed explanation thereof will be omitted.

The optical detector 1G roughly includes a photoelectric conversion layer 110G, a metasurface layer 120G, and a filter layer 130G, for example. In the modification of the fifth embodiment of the present technology, the primary color filters 160 respectively corresponding to the photoelectric conversion elements 101R, 101G, and 101B are included between the photoelectric conversion layer 110G and the metasurface layer 120G.

In FIG. 17, the green photoelectric conversion elements 101G and the red photoelectric conversion elements 101R are alternately arranged in the photoelectric conversion layer 110G.

The filter layer 130G includes a plurality of the complementary color filters 131Y that selectively allow light of specific wavelengths (green and red) in the light condensed by an uppermost on-chip lens (not depicted) to pass therethrough. The metasurface layer 120G includes the metasurface element 121Y that guides red light (indicated by a solid line in FIG. 17) having passed through the complementary color filter 131Y in the filter layer 130G toward the photoelectric conversion element 101R, and guides green light (indicated by a dashed line in FIG. 17) having passed through the complementary color filter 131Y toward the photoelectric conversion element 101G.

In FIG. 18, the green photoelectric conversion elements 101G and the blue photoelectric conversion elements 101B are alternately arranged in the photoelectric conversion layer 110G.

In FIG. 18, the filter layer 130G includes a plurality of the complementary color filters 131C that selectively allow light of specific wavelengths (blue and green) in the light condensed by the uppermost on-chip lens (not depicted) to pass therethrough. The metasurface layer 120G includes the metasurface element 121C that guides green light (indicated by a dashed line in FIG. 18) having passed through the complementary color filter 131C in the filter layer 130G toward the photoelectric conversion element 101G, and guides blue light (indicated by an alternate long and short dash line in FIG. 18) having passed through the complementary color filter 131C toward the photoelectric conversion element 101B.

Effects Provided by Modification of Fifth Embodiment

According to the modification of the fifth embodiment, the similar effect to that provided by the abovementioned second embodiment is provided, and further, the similar effect to that provided by the abovementioned fifth embodiment is provided.

Sixth Embodiment

Figure 19:
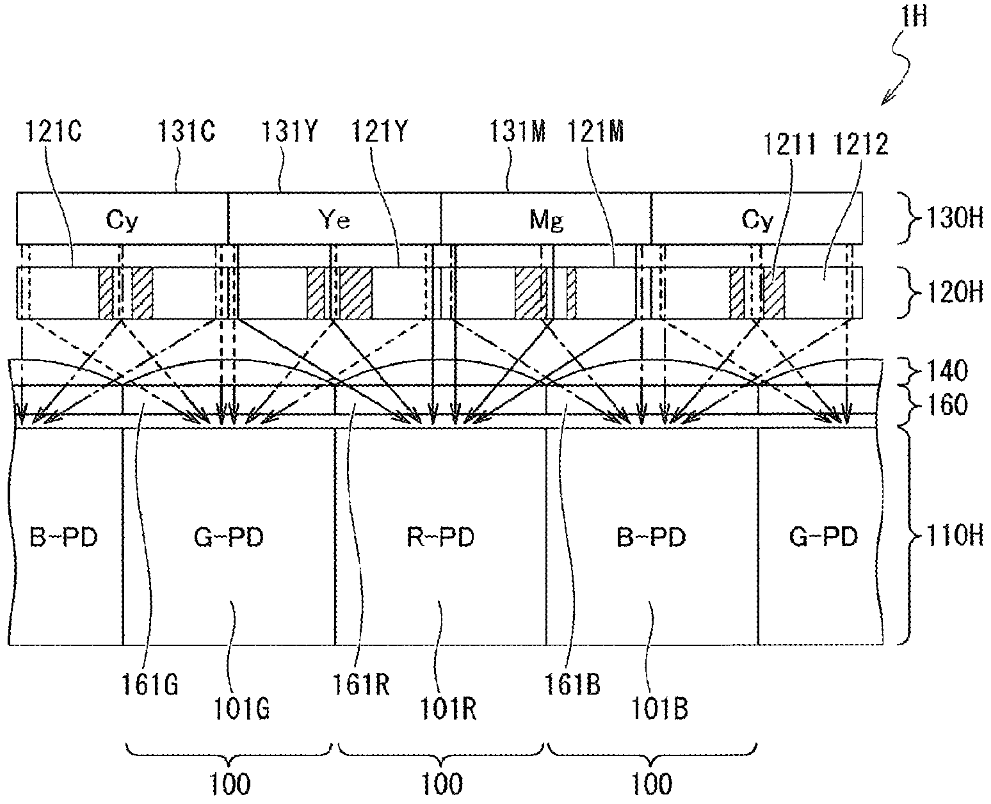
FIG. 19 is a partial longitudinal cross section view of one example of a semiconductor structure of an optical detector according to a sixth embodiment of the present technology.

FIG. 19 is a partial longitudinal cross section view of one example of a semiconductor structure of an optical detector 1H according to a sixth embodiment of the present technology. In FIG. 19, a component identical to that in FIG. 10 and FIG. 16 is denoted by the same reference sign, and a detailed explanation thereof will be omitted.

The optical detector 1H roughly includes a photoelectric conversion layer 110H, a metasurface layer 120H, and a filter layer 130H, for example. In FIG. 19, the green photoelectric conversion element 101G, the red photoelectric conversion element 101R, and the blue photoelectric conversion element 101B are formed in the photoelectric conversion layer 110H.

In the sixth embodiment of the present technology, the on-chip lenses 140 and the primary color filters 160 respectively corresponding to the photoelectric conversion elements 101R, 101G, and 101B are included between the photoelectric conversion layer 110H and the metasurface layer 120H.

Each on-chip lens 140 efficiently condenses light that has passed through the metasurface elements 121C, 121Y, and 121M. Each primary color filter 160 is disposed between the on-chip lens 140 and the corresponding photoelectric conversion element 101R, 101G, or 101B, and selectively allows light of a specific wavelength in the light condensed by the on-chip lens 140 to pass therethrough. In the present embodiment, four primary color filters 161R, 161G, and 161B that selectively allow wavelengths of red light, green light, and blue light, respectively to pass therethrough. However, the primary color filters 160 are not limited to these filters. The primary color filters 160, each of which corresponds to any one of these colors (wavelengths), are provided for respective pixels 100.

Effects Provided by Sixth Embodiment

According to the sixth embodiment, therefore, the similar effect to that provided by the abovementioned first embodiment is provided, and the primary color filters 161R, 161G, and 161B are respectively disposed on the photoelectric conversion elements 101R, 101G, and 101B, so that the sensitivity can be enhanced and color mixing can be suppressed. Accordingly, the color reproduction property can be enhanced.

Modification of Sixth Embodiment

Figure 20:
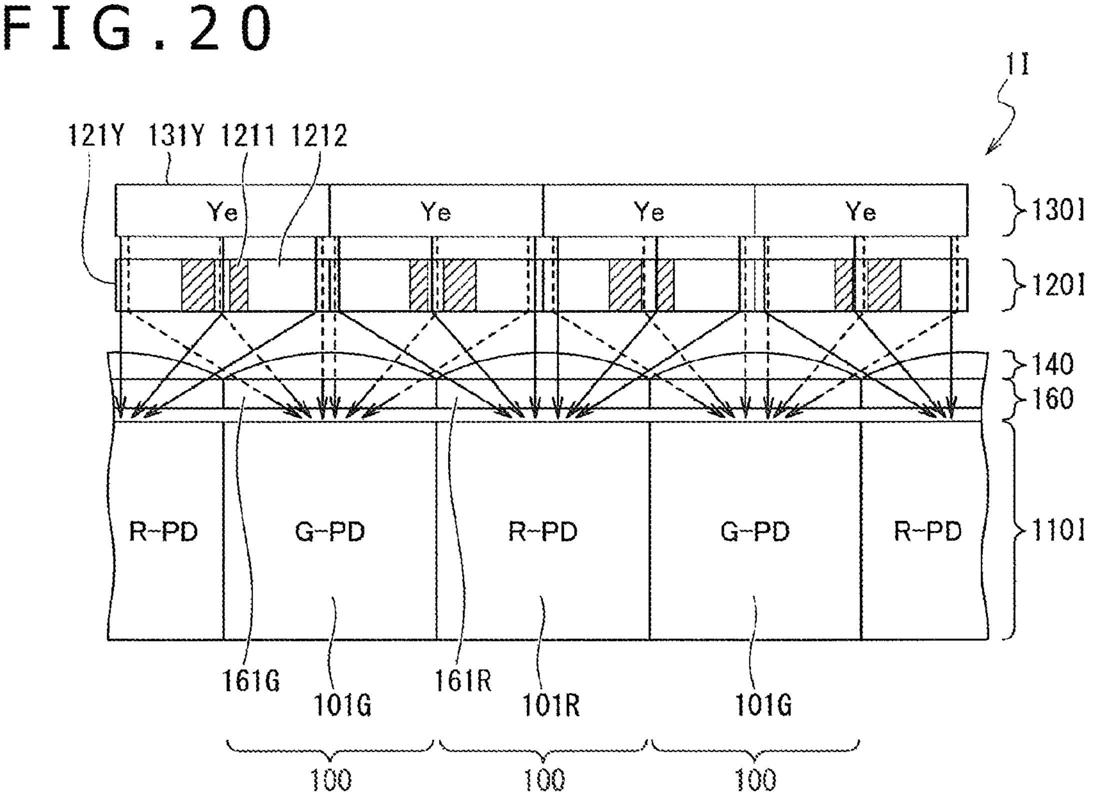
FIG. 20 is a partial longitudinal cross section view (I) of one example of a semiconductor structure of an optical detector according to a modification of the sixth embodiment of the present technology.
Figure 21:
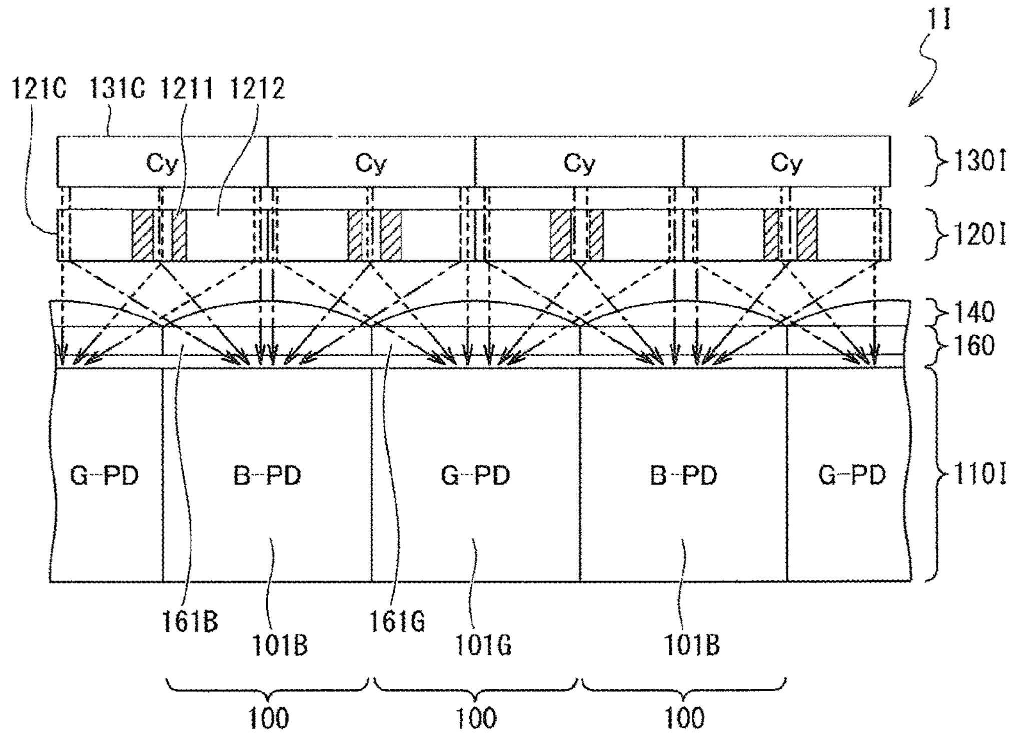
FIG. 21 is a partial longitudinal cross section view (II) of one example of the semiconductor structure of the optical detector according to the modification of the sixth embodiment of the present technology.

FIG. 20 and FIG. 21 are partial longitudinal cross section views of one example of a semiconductor structure of an optical detector 1I according to a modification of the sixth embodiment of the present technology. In FIG. 20 and FIG. 21, a component identical to that in FIG. 7, FIG. 8, FIG. 10, and FIG. 16 is denoted by the same reference sign, and a detailed explanation thereof will be omitted.

The optical detector 1I roughly includes a photoelectric conversion layer 110I, a metasurface layer 120I, and a filter layer 130I, for example. In the modification of the sixth embodiment of the present technology, the on-chip lenses 140 and the primary color filters 160 respectively corresponding to the photoelectric conversion elements 101R, 101G, and 101B are included between the photoelectric conversion layer 110I and the metasurface layer 120I.

In FIG. 20, the green photoelectric conversion elements 101G and the red photoelectric conversion elements 101R are alternately arranged in the photoelectric conversion layer 110I.

In FIG. 20, the filter layer 130I includes a plurality of the complementary color filters 131Y that selectively allow light of specific wavelengths (green and red) in the light condensed by an uppermost on-chip lens (not depicted) to pass therethrough. The metasurface layer 120I includes the metasurface element 121Y that guides red light (indicated by a solid line in FIG. 20) having passed through the complementary color filter 131Y in the filter layer 130G toward the photoelectric conversion element 101R, and guides green light (indicated by a dashed line in FIG. 20) having passed through the complementary color filter 131Y toward the photoelectric conversion element 101G.

In FIG. 21, the green photoelectric conversion elements 101G and the blue photoelectric conversion elements 101B are alternately arranged in the photoelectric conversion layer 110I.

In FIG. 21, the filter layer 130I includes a plurality of the complementary color filters 131C that selectively allow light of specific wavelengths (blue and green) in the light condensed by the uppermost on-chip lens (not depicted) to pass therethrough. The metasurface layer 120I includes the metasurface element 121C that guides green light (indicated by a dashed line in FIG. 21) having passed through the complementary color filter 131C in the filter layer 130G toward the photoelectric conversion element 101G, and guides blue light (indicated by an alternate long and short dash line in FIG. 21) having passed through the complementary color filter 131C toward the photoelectric conversion element 101B.

Effects Provided by Modification of Sixth Embodiment

According to the modification of the sixth embodiment, the similar effect to that provided by the abovementioned second embodiment is provided, and further, the similar effect to that provided by the abovementioned sixth embodiment is provided.

Seventh Embodiment

Figure 22:
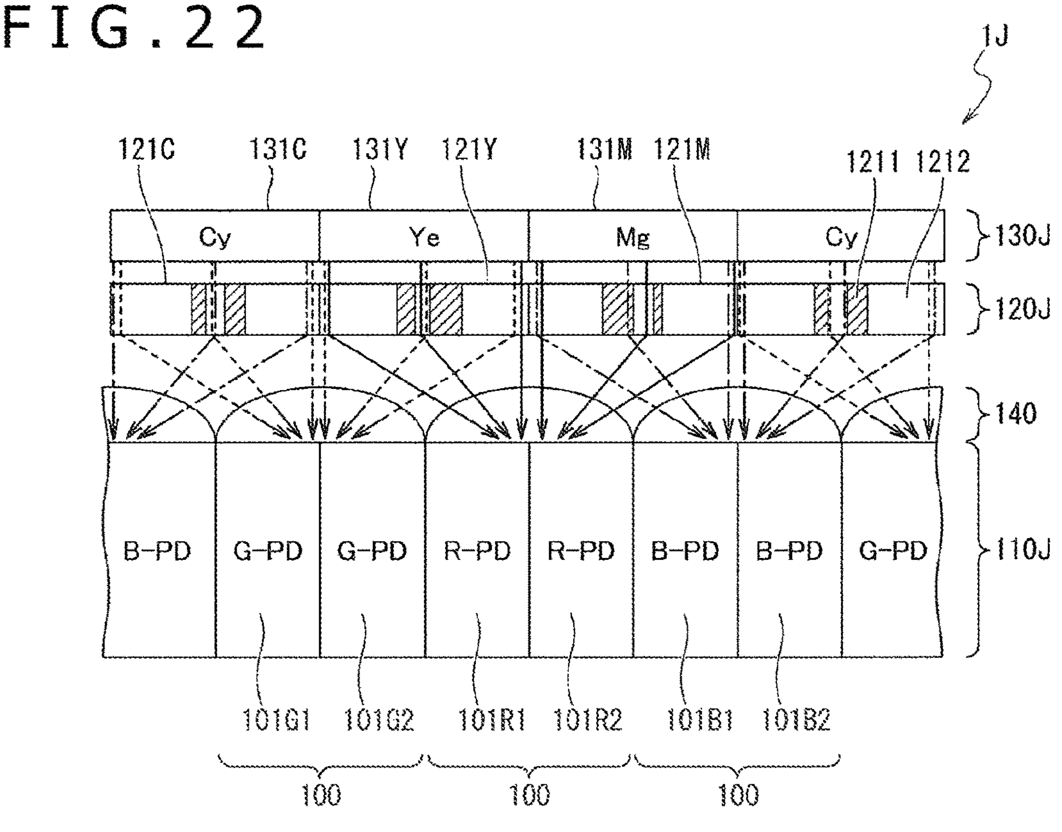
FIG. 22 is a partial longitudinal cross section view of one example of a semiconductor structure of an optical detector according to a seventh embodiment of the present technology.

FIG. 22 is a partial longitudinal cross section view of one example of a semiconductor structure of an optical detector 1J according to a seventh embodiment of the present technology. In FIG. 22, a component identical to that in FIG. 10 is denoted by the same reference sign, and a detailed explanation thereof will be omitted.

The optical detector 1J roughly includes a photoelectric conversion layer 110J, a metasurface layer 120J, a filter layer 130J, and the on-chip lenses 140, for example. In the photoelectric conversion layer 110J depicted in FIG. 22, a green photoelectric conversion element is split into two split photoelectric conversion elements 101G1 and 101G2, a red photoelectric conversion element is split into two split photoelectric conversion elements 101R1 and 101R2, and a blue photoelectric conversion element is split into two split photoelectric conversion elements 101B1 and 101B2.

In the seventh embodiment of the present technology, the on-chip lenses 140 efficiently condense light that has passed through the metasurface elements 121C, 121Y, and 121M, and form an image on the pixels 100 in the photoelectric conversion layer 110B. The on-chip lenses 140 are provided for respective pixels 100.

The green split photoelectric conversion elements 101G1 and 101G2 in the photoelectric conversion layer 110J each generate an electric charge according to the intensity of incident green light from the on-chip lenses 140, convert the electric charge into an electric signal, and output the electric signal as a pixel signal. Then, from the outputs of the split photoelectric conversion elements 101G1 and 101G2, parallax information regarding the green light is obtained. Accordingly, image plane phase difference auto-focusing (AF) can be performed on the green light.

The red split photoelectric conversion elements 101R1 and 101R2 in the photoelectric conversion layer 110J each generate an electric charge according to the intensity of incident red light from the on-chip lenses 140, convert the electric charge into an electric signal, and output the electric signal as a pixel signal. Then, from the outputs of the split photoelectric conversion elements 101R1 and 101R2, parallax information regarding the red light is obtained. Accordingly, image plane phase difference auto-focusing (AF) can be performed on the red light.

The blue split photoelectric conversion elements 101B1 and 101B2 in the photoelectric conversion layer 110J each generate an electric charge according to the intensity of incident blue light from the on-chip lenses 140, convert the electric charge into an electric signal, and output the electric signal as a pixel signal. Then, from the outputs of the split photoelectric conversion elements 101B1 and 101B2, parallax information regarding the blue light is obtained. Accordingly, image plane phase difference auto-focusing (AF) can be performed on the blue light.

Effects Provided by Seventh Embodiment

According to the seventh embodiment, parallax information regarding the same blue light can be obtained from outputs of a plurality of the split photoelectric conversion elements 101B1 and 101B2, for example, in the abovementioned manner. Accordingly, image plane phase difference auto-focusing can be performed on the blue light.

It is to be noted that the two split photoelectric conversion elements 101B1 and 101B2 are provided in the seventh embodiment, but four split photoelectric conversion elements may be provided alternatively. Further, the on-chip lenses 140 are optional in the seventh embodiment.

Modification of Seventh Embodiment

Figure 23:
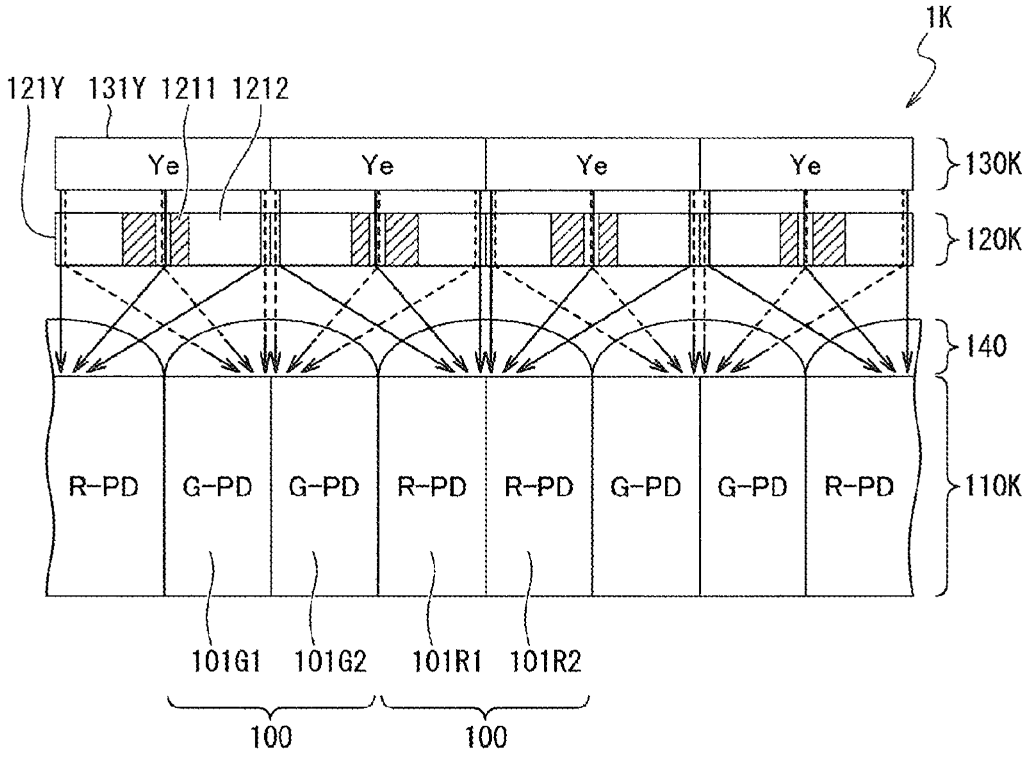
FIG. 23 is a partial longitudinal cross section view (I) of one example of a semiconductor structure of an optical detector according to a modification of the seventh embodiment of the present technology.
Figure 24:
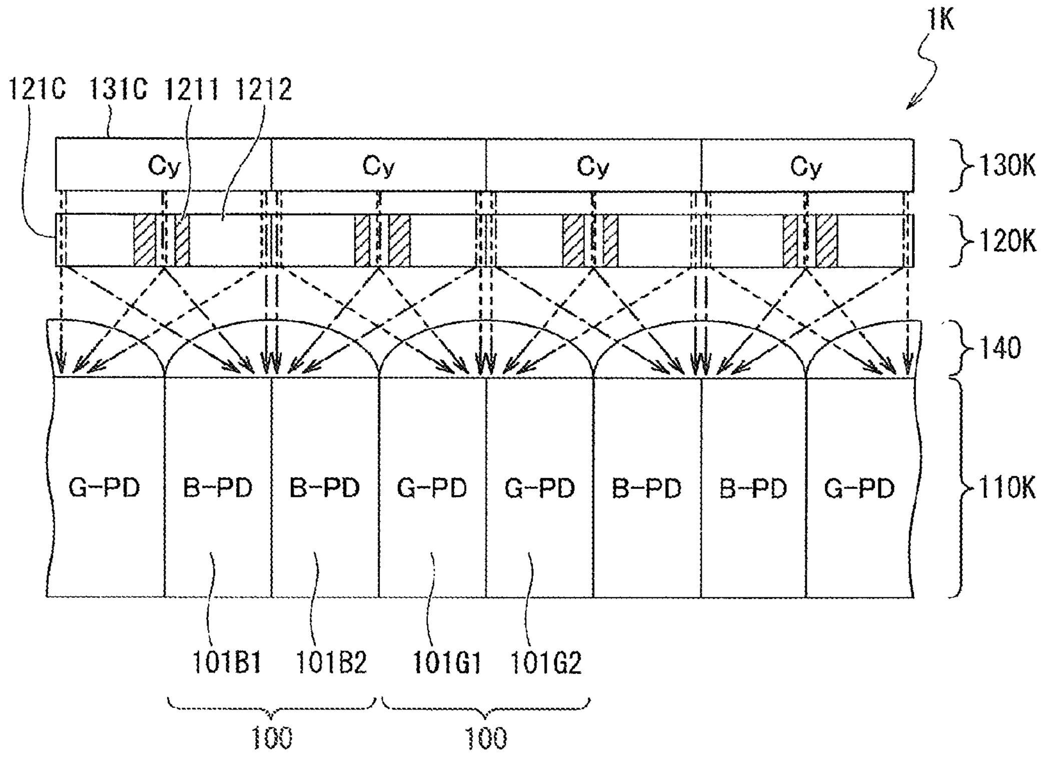
FIG. 24 is a partial longitudinal cross section view (II) of one example of the semiconductor structure of the optical detector according to the modification of the seventh embodiment of the present technology.

FIG. 23 and FIG. 24 are partial longitudinal cross section views of one example of a semiconductor structure of an optical detector 1K according to a modification of the seventh embodiment of the present technology. In FIG. 23 and FIG. 24, a component identical to that in FIG. 7, FIG. 8, and FIG. 10 is denoted by the same reference sign, and a detailed explanation thereof will be omitted.

The optical detector 1K roughly includes a photoelectric conversion layer 110K, a metasurface layer 120K, a filter layer 130K, and the on-chip lenses 140, for example.

In the photoelectric conversion layer 110K in FIG. 23, a green photoelectric conversion element is split into two split photoelectric conversion elements 101G1 and 101G2, and a red photoelectric conversion element is split into two split photoelectric conversion elements 101R1 and 101R2.

In FIG. 23, the filter layer 130K includes a plurality of the complementary color filters 131Y that selectively allow light of specific wavelengths (green and red) in light condensed by an uppermost on-chip lens (not depicted) to pass therethrough. The metasurface layer 120K includes the metasurface element 121Y that guides red light (indicated by a solid line in FIG. 23) having passed through the complementary color filter 131Y in the filter layer 130K toward the split photoelectric conversion elements 101R1 and 101R2, and guides green light (indicated by a dashed line in FIG. 23) having passed through the complementary color filter 131Y toward the split photoelectric conversion elements 101G1 and 101G2.

In the photoelectric conversion layer 110K in FIG. 24, a green photoelectric conversion element is split into two split photoelectric conversion elements 101G1 and 101G2, and a blue photoelectric conversion element is split into two split photoelectric conversion elements 101B1 and 101B2.

In FIG. 24, the filter layer 130K includes a plurality of the complementary color filters 131C that selectively allow light of specific wavelengths (blue and green) in the light condensed by the uppermost on-chip lens (not depicted) to pass therethrough. The metasurface layer 120K includes the metasurface element 121C that guides green light (indicated by a dashed line in FIG. 24) having passed through the complementary color filter 131C in the filter layer 130K toward the split photoelectric conversion elements 101G1 and 101G2, and guides blue light (indicated by an alternate long and short dash line in FIG. 24) having passed through the complementary color filter 131C toward the split photoelectric conversion elements 101B1 and 101B2.

Effects Provided by Modification of Seventh Embodiment

According to the modification of the seventh embodiment, the similar effect to that provided by the abovementioned second embodiment is provided, and further, the similar effect to that provided by the abovementioned seventh embodiment is provided.

Eighth Embodiment

Figure 25:
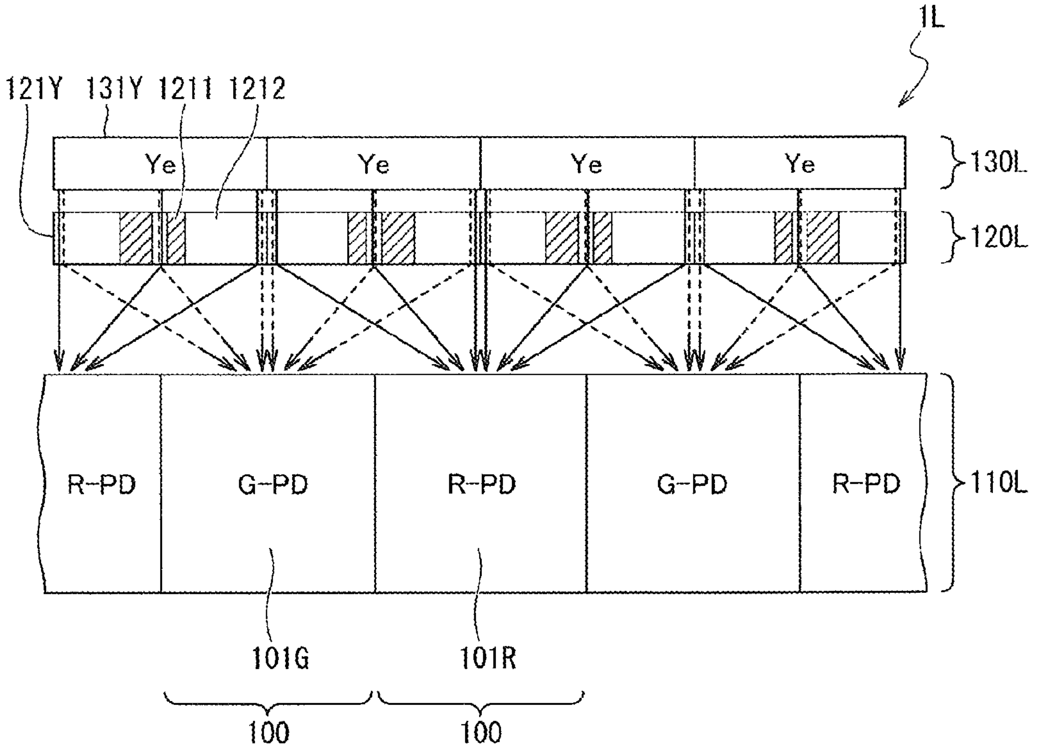
FIG. 25 is a partial longitudinal cross section view (I) of one example of a semiconductor structure of an optical detector according to an eighth embodiment of the present technology.
Figure 26:
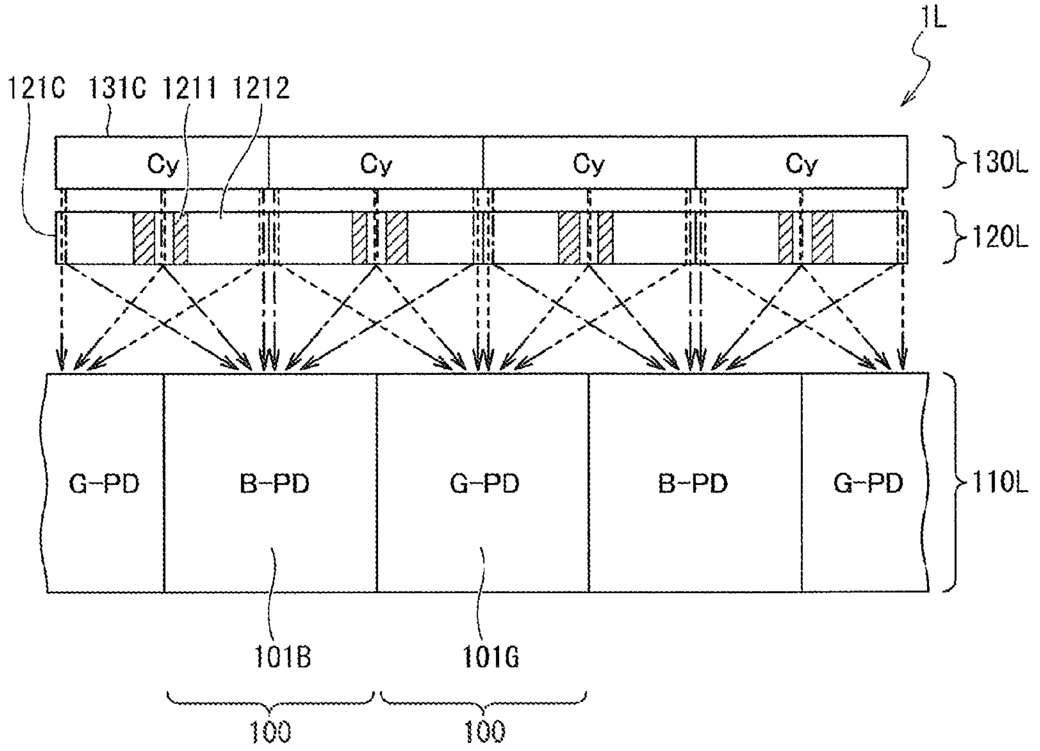
FIG. 26 is a partial longitudinal cross section view (II) of one example of the semiconductor structure of the optical detector according to the eighth embodiment of the present technology.

FIG. 25 and FIG. 26 are partial longitudinal cross section views of one example of a semiconductor structure of an optical detector 1L according to an eighth embodiment of the present technology. In FIG. 25 and FIG. 26, a component identical to that in FIG. 7 and FIG. 8 is denoted by the same reference sign, and a detailed explanation thereof will be omitted.

The optical detector 1L roughly includes a photoelectric conversion layer 110L, a metasurface layer 120L, and a filter layer 130L, for example. In FIG. 25, the green photoelectric conversion elements 101G and the red photoelectric conversion elements 101R are alternately arranged in the photoelectric conversion layer 110L.

The filter layer 130L includes a plurality of the complementary color filters 131Y that selectively allow light of specific wavelengths (green and red) in light condensed by an on-chip lens to pass therethrough. The metasurface layer 120L includes the metasurface element 121Y that guides red light (indicated by a solid line in FIG. 25) having passed through the complementary color filter 131Y in the filter layer 130L toward the photoelectric conversion element 101R, and guides green light (indicated by a dashed line in FIG. 25) having passed through the complementary color filter 131Y toward the photoelectric conversion element 101G.

In FIG. 26, the green photoelectric conversion elements 101G and the blue photoelectric conversion elements 101B are alternately arranged in the photoelectric conversion layer 110L.

The filter layer 130L includes a plurality of the complementary color filters 131C that selectively allow light of specific wavelengths (blue and green) in the light condensed by the on-chip lens to pass therethrough. The metasurface layer 120L includes the metasurface element 121C that guides green light (indicated by a dashed line in FIG. 26) having passed through the complementary color filter 131C in the filter layer 130L toward the photoelectric conversion element 101G, and guides blue light (indicated by an alternate long and short dash line in FIG. 26) having passed through the complementary color filter 131C toward the photoelectric conversion element 101B.

Figure 27A:
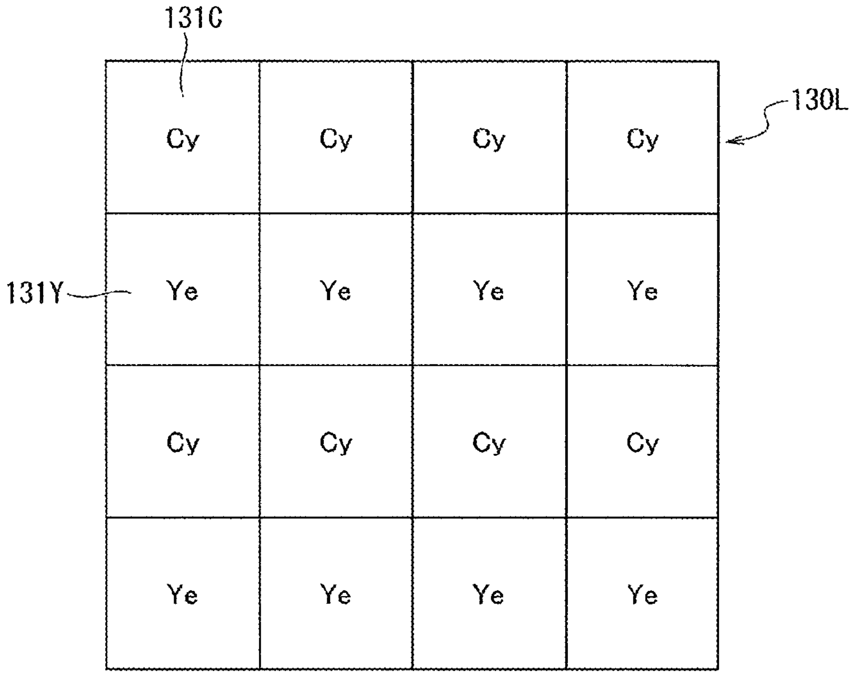
FIG. 27A is a plan view of a filter layer according to the eighth embodiment.

FIG. 27A illustrates the filter layer 130L in a plan view. As depicted in FIG. 27A, a Bayer array, in which a plurality of the complementary color filters 131C are arranged in one row and a plurality of complementary color filters 131Y are arranged in one row, is formed. In FIG. 27A, the cyan complementary color filter 131C and the yellow complementary color filter 131Y are schematically denoted by “Cy” and “Ye,” respectively.

Figure 27B:
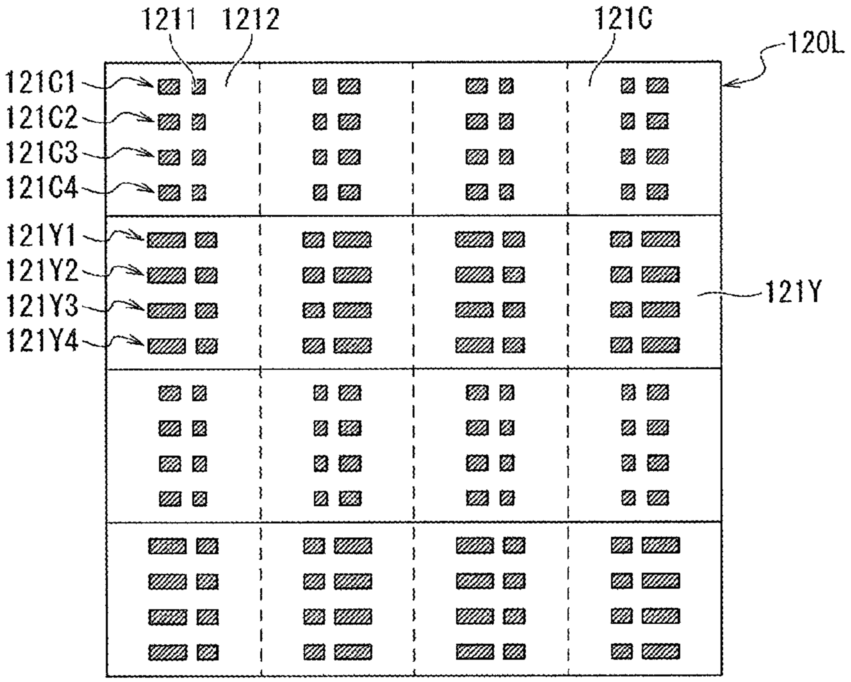
FIG. 27B is a plan view of a metasurface layer according to the eighth embodiment.

FIG. 27B illustrates the metasurface layer 120L in a plan view. As depicted in FIG. 27B, a plurality of the metasurface elements 121C and 121Y are arranged in a Bayer array. In one example, the high-refractive index materials 1211 are formed into pillar shapes. In the metasurface element 121C, four pairs of high refractive index materials 121C1, 121C2, 121C3, and 121C4, of the plurality of pillar-shaped high-refractive index materials 1211, are arranged in a line, for example. Also in the metasurface element 121Y, four pairs of high refractive index materials 121Y1, 121Y2, 121Y3, and 121Y4, of the plurality of pillar-shaped high-refractive index materials 1211, are arranged in a line, for example. It is to be noted that the pillar shape may be a polygonal shape, a rectangular shape, or a circular shape. Such a shape eliminates polarization. In addition, in the metasurface element 121C in FIG. 27B, the left ones of the high-refractive index materials 1211 are wider in the first column, and the right ones of the high-refractive index materials 1211 are wider in the second column. Also, in the metasurface element 121Y in FIG. 27B, the left ones of the high-refractive index materials 1211 are wider in the first column, and the right ones of the high-refractive index materials 1211 are wider in the second column.

Figure 27C:
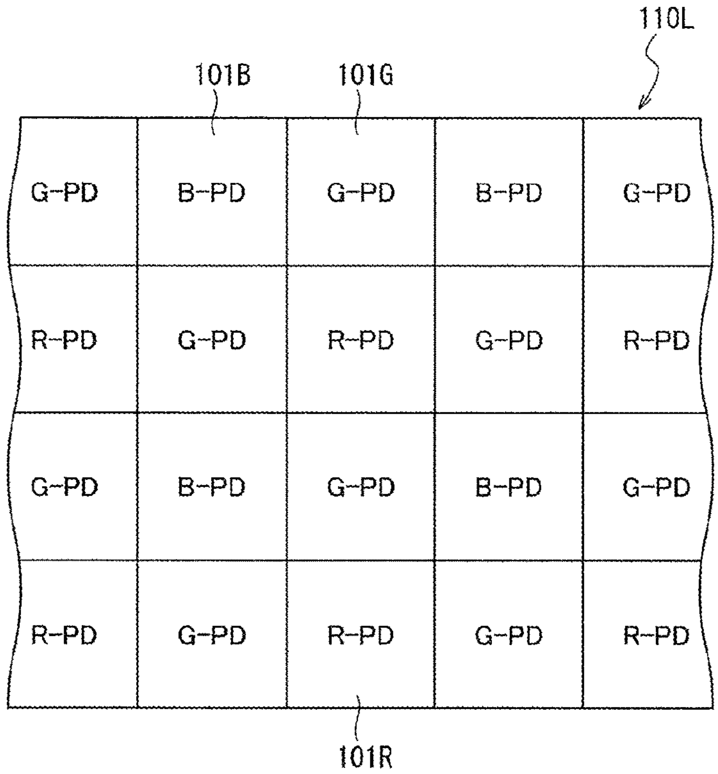
FIG. 27C is a plan view of a photoelectric conversion layer according to the eighth embodiment.

FIG. 27C illustrates the photoelectric conversion layer 110L in a plan view. As depicted in FIG. 27C, a plurality of the photoelectric conversion elements 101R, 101G, and 101B are arranged in a Bayer array. In FIG. 27C, the red photoelectric conversion element 101R, the green photoelectric conversion element 101G, and the blue photoelectric conversion element 101B are schematically denoted by “R-PD,” “G-PD,” and “B-PD,” respectively.

Effects Provided by Eighth Embodiment

According to the eighth embodiment, the similar effect to that provided by the abovementioned first embodiment is provided, and the similar effect to that provided by the abovementioned second embodiment is provided. Furthermore, since the high-refractive index materials 1211 are formed into pillar shapes, polarization can be eliminated.

Ninth Embodiment

Figure 28:
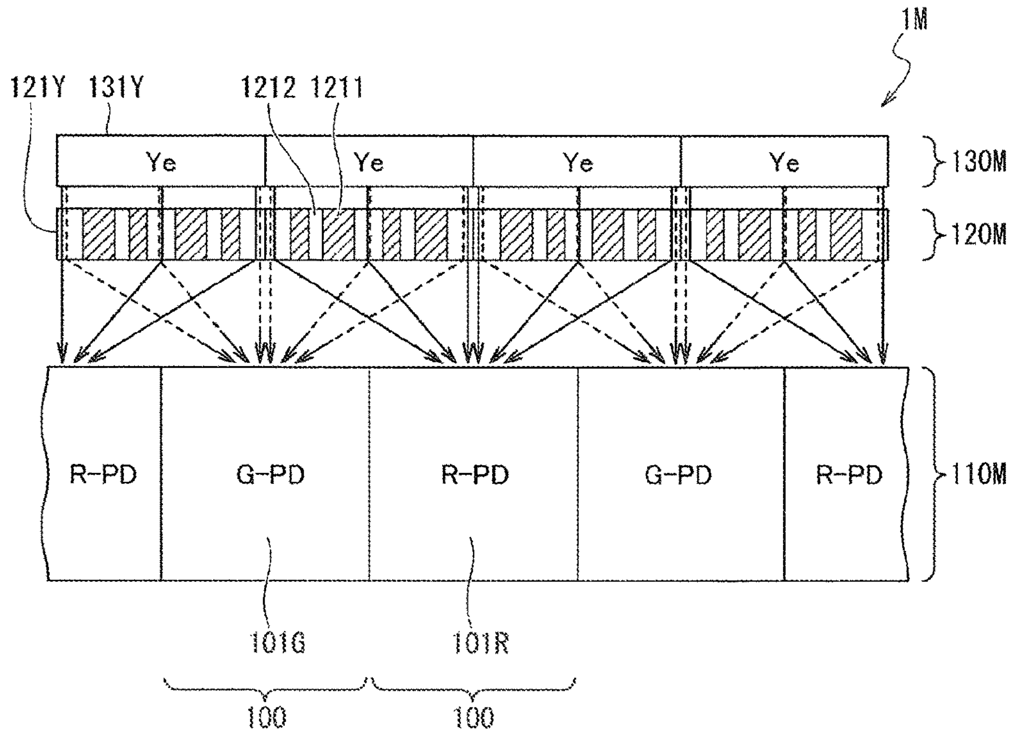
FIG. 28 is a partial longitudinal cross section view (I) of one example of a semiconductor structure of an optical detector according to a ninth embodiment of the present technology.
Figure 29:
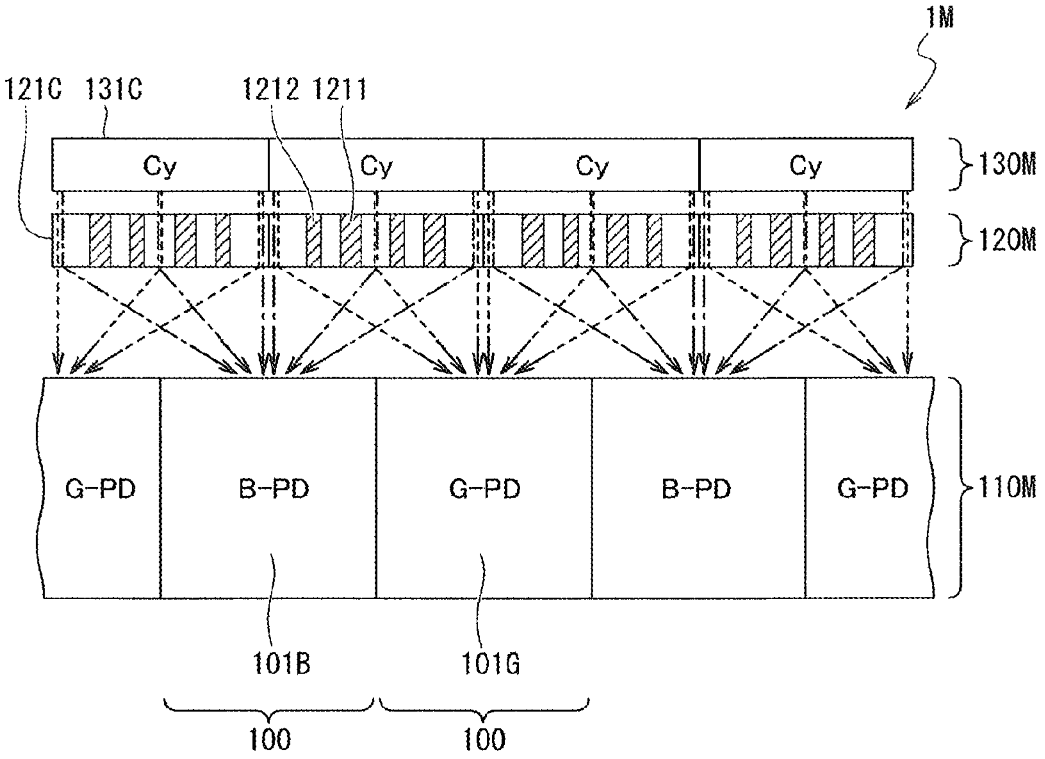
FIG. 29 is a partial longitudinal cross section view (II) of one example of the semiconductor structure of the optical detector according to the ninth embodiment of the present technology.

FIG. 28 and FIG. 29 are partial longitudinal cross section views of one example of a semiconductor structure of an optical detector 1M according to a ninth embodiment of the present technology. In FIG. 28 and FIG. 29, a component identical to that in FIG. 7 and FIG. 8 is denoted by the same reference sign, and a detailed explanation thereof will be omitted.

The optical detector 1M roughly includes a photoelectric conversion layer 110M, a metasurface layer 120M, and a filter layer 130M, for example. In FIG. 28, the green photoelectric conversion elements 101G and the red photoelectric conversion elements 101R are alternately arranged in the photoelectric conversion layer 110M.

The filter layer 130M includes a plurality of the complementary color filters 131Y that selectively allow light of specific wavelengths (green and red) in light condensed by an on-chip lens to pass therethrough. The metasurface layer 120M includes the metasurface element 121Y that guides red light (indicated by a solid line in FIG. 28) having passed through the complementary color filter 131Y in the filter layer 130M toward the photoelectric conversion element 101R, and guides green light (indicated by a dashed line in FIG. 28) having passed through the complementary color filter 131Y toward the photoelectric conversion element 101G.

In FIG. 29, the green photoelectric conversion elements 101G and the blue photoelectric conversion elements 101B are alternately arranged in the photoelectric conversion layer 110M.

The filter layer 130M includes a plurality of the complementary color filters 131C that selectively allow light of specific wavelengths (blue and green) in the light condensed by the on-chip lens to pass therethrough. The metasurface layer 120M includes the metasurface element 121C that guides green light (indicated by a dashed line in FIG. 29) having passed through the complementary color filter 131C in the filter layer 130M toward the photoelectric conversion element 101G, and guides blue light (indicated by an alternate long and short dash line in FIG. 29) having passed through the complementary color filter 131C toward the photoelectric conversion element 101B.

Figure 30A:
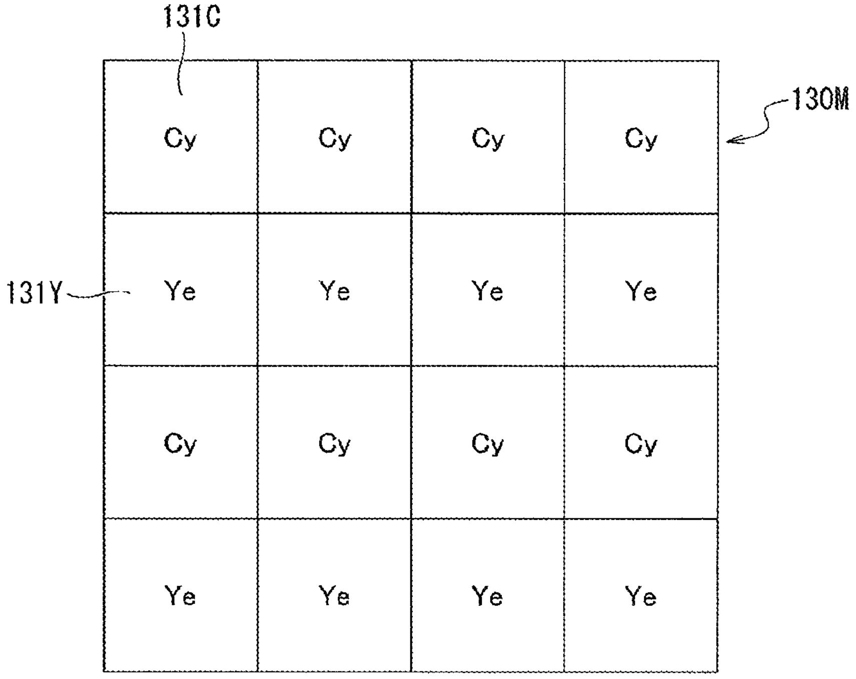
FIG. 30A is a plan view of a filter layer according to the ninth embodiment.

FIG. 30A illustrates the filter layer 130M in a plan view. As depicted in FIG. 30A, a Bayer array in which a plurality of the complementary color filters 131C are arranged in one row while a plurality of the complementary color filters 131Y are arranged in one row is provided. In FIG. 30A, the cyan complementary color filter 131C and the yellow complementary color filter 131Y are schematically denoted by “Cy” and “Ye,” respectively.

Figure 30B:
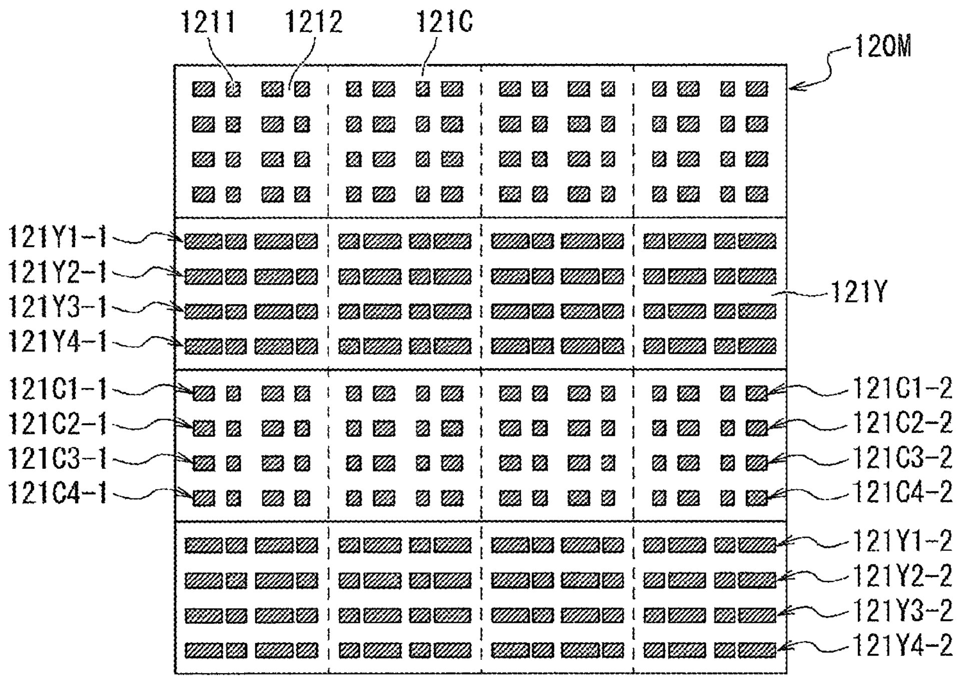
FIG. 30B is a plan view of a metasurface layer according to the ninth embodiment.

FIG. 30B illustrates the metasurface layer 120M in a plan view. As depicted in FIG. 30B, a plurality of the metasurface elements 121C and 121Y are arranged in a Bayer array. In one example, the high-refractive index materials 1211 are formed into pillar shapes. It is to be noted that, in the metasurface elements 121C in FIG. 30B, the left ones of the high-refractive index materials 1211 are wider in the first column, and the right ones of the high-refractive index materials 1211 are wider in the second column. Also, in the metasurface elements 121Y in FIG. 30B, the left ones of the high-refractive index materials 1211 are wider in the first column, and the right one of the high-refractive index materials 1211 are wider in the second column.

In each metasurface element 121C, four pairs of high-refractive index materials 121C1-1, 121C2-1, 121C3-1, and 121C4-1, of the plurality of pillar-shaped high-refractive index materials 1211, are arranged in a line on the left side in FIG. 30B, for example. Further, four pairs of high-refractive index materials 121C1-2, 121C2-2, 121C3-2, and 121C4-2 are arranged in a line on the right side in FIG. 30B, for example.

In each metasurface element 121Y, four pairs of high-refractive index materials 121Y1-1, 121Y2-1, 121Y3-1, and 121Y4-1, of the plurality of pillar-shaped high-refractive index materials 1211, are arranged in a line on the left side in FIG. 30B, for example. Further, four pairs of high-refractive index materials 121Y1-2, 121Y2-2, 121Y3-2, and 121Y4-2 are arranged in a line on the right side in FIG. 30B, for example. It is to be noted that the pillar shape may be a polygonal shape, a rectangular shape, or a circular shape. Such a shape eliminates polarization.

Figure 30C:
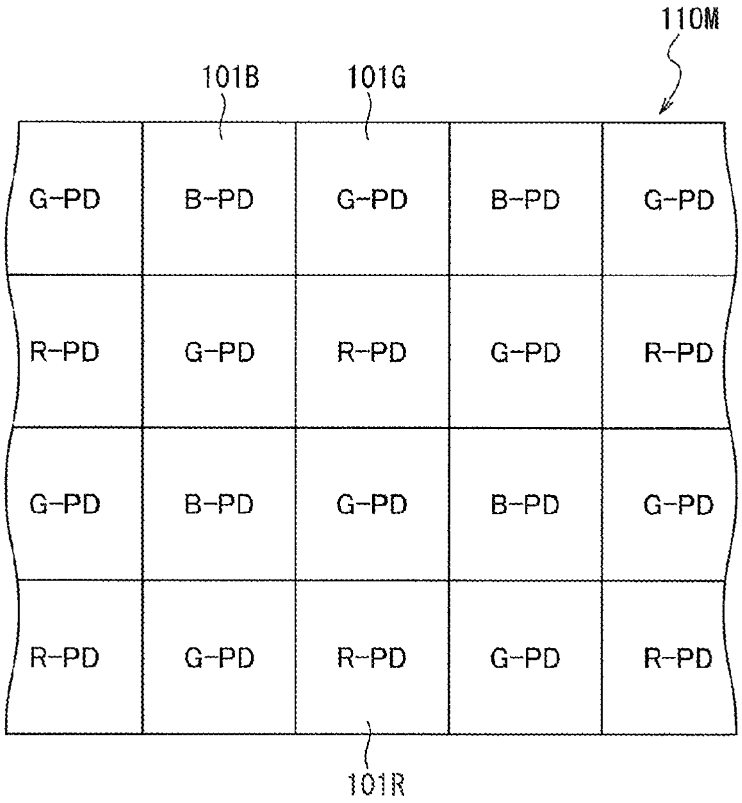
FIG. 30C is a plan view of a photoelectric conversion layer according to the ninth embodiment.

FIG. 30C illustrates the photoelectric conversion layer 110M in a plan view. As depicted in FIG. 30C, a plurality of the photoelectric conversion elements 101R, 101G, and 101B are arranged in a Bayer array. In FIG. 30C, the red photoelectric conversion element 101R, the green photoelectric conversion element 101G, and the blue photoelectric conversion element 101B are schematically denoted by “R-PD,” “G-PD,” and “B-PD,” respectively.

Effects Provided by Ninth Embodiment

According to the ninth embodiment, the similar effect to that provided by the abovementioned first embodiment is provided, and further, the similar effect to that provided by the abovementioned second embodiment is provided. Furthermore, since the high-refractive index materials 1211 are formed into pillar shapes, polarization can be eliminated.

It is to be noted that the four pairs of the high-refractive index materials 121C1-1, 121C2-1, 121C3-1, and 121C4-1 are arranged in one column and the four pairs of the high-refractive index materials 121C1-2, 121C2-2, 121C3-2, and 121C4-2 are arranged in one column in the metasurface element 121C of the ninth embodiment, but these pairs may be formed in two or more columns.

Tenth Embodiment

According to a tenth embodiment of the present technology, a plurality of complementary color filters and a plurality of metasurface elements are arranged according to what is called pupil compensation in order to efficiently use light around the periphery of the viewing angle of an optical detector. Specifically, a complementary color filter and a metasurface element corresponding to a pixel that is located in the center of the viewing angle (where the image height is zero) are arranged to have an optical axis substantially matching the center of the pixel, while a complementary color filter and a metasurface element corresponding to a pixel that is located closer to the periphery of the viewing angle (where the image height is higher) are arranged to be further offset from the center of the pixel. In other words, the positions of the complementary color filters and the metasurface elements closer to the periphery of the viewing angle are further offset according to the emission direction of a principal light beam. It is to be noted that a complementary color filter and a metasurface element in a corner area of the viewing angle are offset longitudinally and laterally from the center of the pixel. As a result of this pupil compensation, a principal light beam that is obliquely incident on a periphery of a viewing angle can be used.

OTHER EMBODIMENTS

The present technology has been explained by the first to tenth embodiments and the modifications. It should not be construed that the present technology is specified by the description and drawings, which are a part of the present disclosure. It will be clear to a person skilled in the art who understands the concept of the technology disclosed in the first to tenth embodiments and the modifications that the present technology can include a variety of alternative embodiments, examples, and implementations. In addition, the configurations disclosed in the first to tenth embodiments and the modifications can be appropriately combined as long as inconsistency is not caused. For example, the configurations disclosed in different embodiments may be combined together, and the different modifications of the same embodiment may be combined together.

Examples of Applications to Mobile Bodies

A technology according to the present disclosure (present technology) is applicable to a variety of products. For example, the technology according to the present disclosure may be realized as a device to be installed on a mobile body such as an automobile, an electric automobile, a hybrid electric automobile, a motor cycle, a bicycle, a personal mobility, an airplane, a drone, a ship, or a robot.

Figure 31:
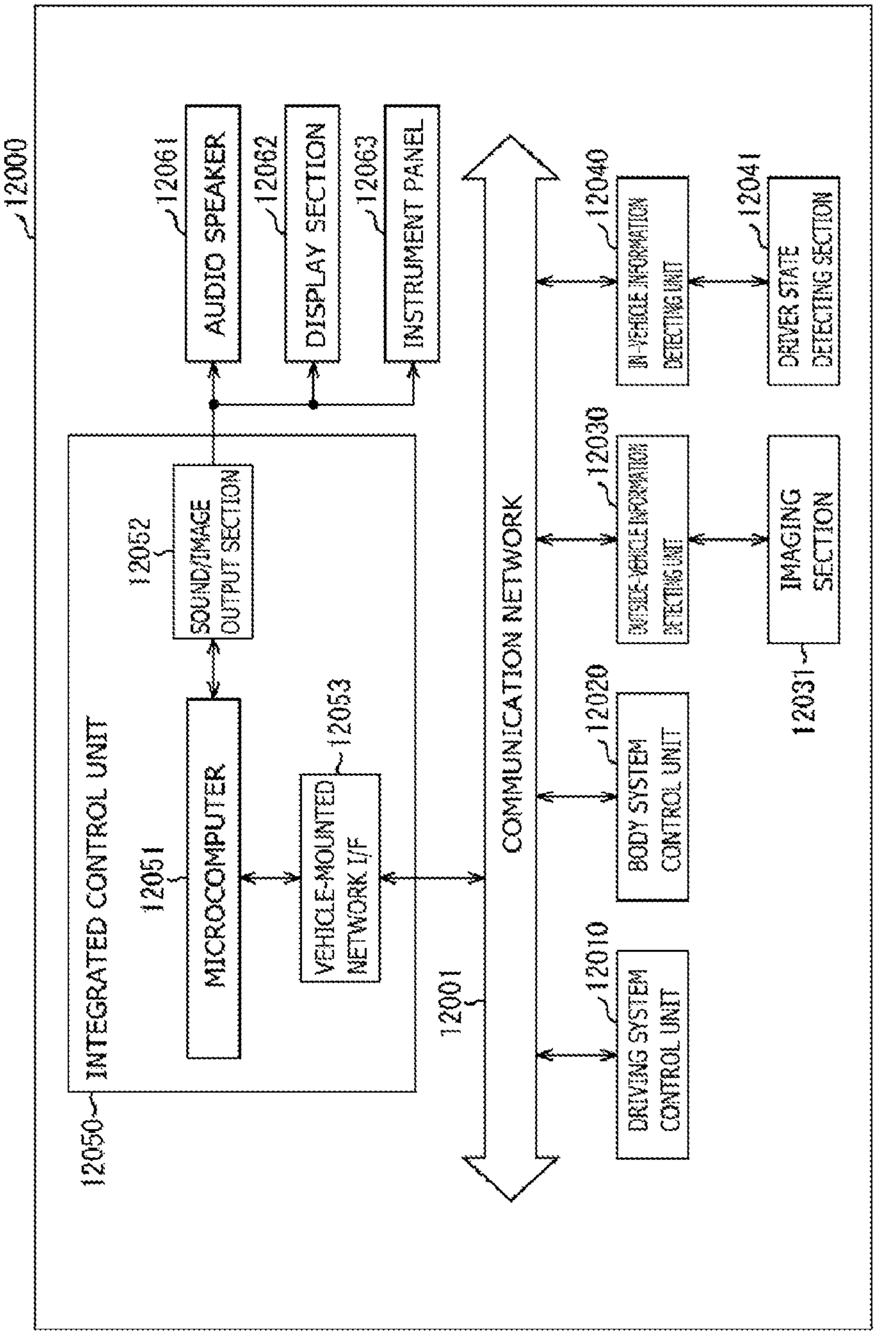
FIG. 31 is a block diagram depicting an example of schematic configuration of a vehicle control system.

FIG. 31 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 31, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 31, an audio speaker 12061, a display section 12062, and an instrument panel 12063 are illustrated as the output device. The display section 12062 may, for example, include at least one of an on-board display and a head-up display.

Figure 32:
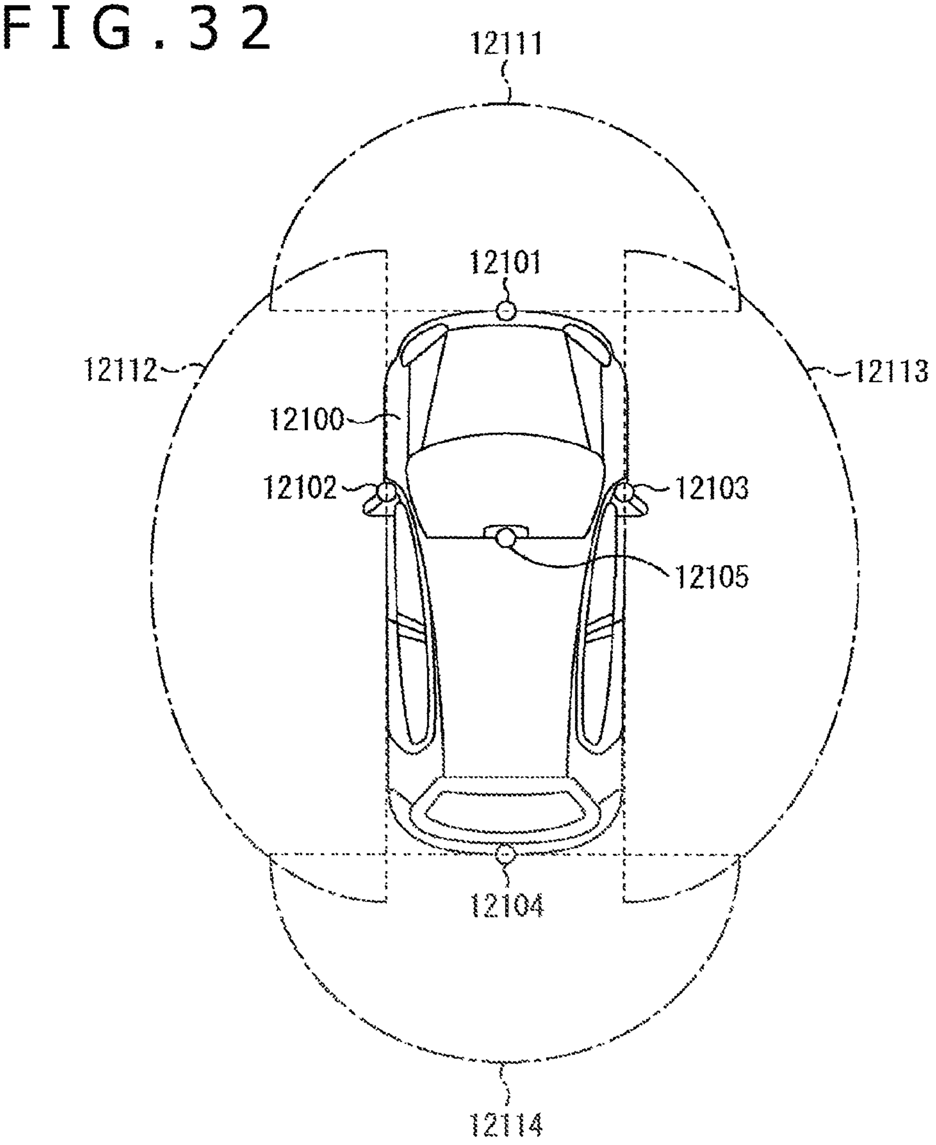
FIG. 32 is a diagram of assistance in explaining an example of installation positions of an outside-vehicle information detecting section and an imaging section.

FIG. 32 is a diagram depicting an example of the installation position of the imaging section 12031.

In FIG. 32, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 32 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

One example of the vehicle control system to which the technology according to the present disclosure is applicable has been explained so far. The technology according to the present disclosure is applicable to the imaging section 12031 of the abovementioned configuration, for example. Specifically, the optical detector 1 in FIG. 1 is applicable to the imaging section 12031.

It is to be noted that the present disclosure can also adopt the following configurations.

(1)

An optical detector including:

a photoelectric conversion layer in which a plurality of photoelectric conversion elements that generate electric charges by photoelectric conversion based on incident light is formed in a matrix shape;

a filter layer including a plurality of complementary color filters that are arranged on an incident surface of the photoelectric conversion layer in a manner corresponding to the plurality of photoelectric conversion elements and that each block light of a specific wavelength in the incident light; and a metasurface layer including a plurality of metasurface elements that are arranged between the photoelectric conversion layer and the filter layer in a manner corresponding to the plurality of photoelectric conversion elements and that each include a plurality of refractive index materials varying according to wavelengths and having a pitch smaller than a target light wavelength, in which each of the plurality of metasurface elements separates, by wavelengths, light having passed through the complementary color filters, into components through the plurality of refractive index materials, and guides the components of the light separated by wavelengths toward the corresponding photoelectric conversion elements.

(2)

The optical detector according to (1) above, in which, in the filter layer, a plurality of first complementary color filters of the plurality of complementary color filters are arranged in a row direction or a column direction, and a plurality of second complementary color filters of the plurality of complementary color filters are arranged in the row direction or the column direction and has a wavelength that is different from a wavelength that the first complementary color filters block.

(3)

The optical detector according to (1) above, further including:

on-chip lenses that are disposed between the metasurface layer and the photoelectric conversion layer in a manner corresponding to the plurality of photoelectric conversion elements and that condense the light components of the wavelengths separated by the metasurface elements.

(4)

The optical detector according to (1) above, further including:

primary color filters that are arranged between the metasurface layer and the photoelectric conversion layer in a manner corresponding to the plurality of photoelectric conversion elements and that each allow light of a specific wavelength in the light of wavelengths separated by the metasurface elements to pass therethrough.

(5)

The optical detector according to (1) above, further including:

on-chip lenses that are disposed between the metasurface layer and the photoelectric conversion layer in a manner corresponding to the plurality of photoelectric conversion elements and that condense the light components of the wavelengths separated by the metasurface elements; and primary color filters that are arranged between the on-chip lenses and the photoelectric conversion layer in a manner corresponding to the plurality of photoelectric conversion elements and that each allow light of a specific wavelength in the light of wavelengths separated by the metasurface elements to pass therethrough.

(6)

The optical detector according to (1) above, in which each of the photoelectric conversion elements in the photoelectric conversion layer is split into a plurality of split photoelectric conversion elements of the same color, and the photoelectric conversion layer has an image plane phase difference function which uses outputs of the respective split photoelectric conversion elements.

(7)

The optical detector according to (1) above, in which, in a case where the photoelectric conversion elements are arranged on a pixel basis, when a width of each pixel is regarded as one cycle, the complementary color filters and the metasurface elements are deviated from the corresponding photoelectric conversion elements by half cycle.

(8)

The optical detector according to (1) above, in which, in each of the metasurface elements, one pair of refractive index materials of the plurality of refractive index materials are formed into line shapes or pillar shapes.

(9)

The optical detector according to (8) above, in which, in each of the metasurface elements, a plurality of pairs of the refractive index materials are formed into pillar shapes.

(10)

The optical detector according to (3) or (5) above, in which each of the on-chip lenses is formed into a circular shape or a box-like shape.

(11)

An electronic apparatus including:

an optical detector including a photoelectric conversion layer in which a plurality of photoelectric conversion elements that generate electric charges by photoelectric conversion based on incident light is formed in a matrix shape;

a filter layer including a plurality of complementary color filters that are arranged on an incident surface of the photoelectric conversion layer in a manner corresponding to the plurality of photoelectric conversion elements and that each block a specific wavelength in the incident light; and a metasurface layer including a plurality of metasurface elements that are arranged between the photoelectric conversion layer and the filter layer in a manner corresponding to the plurality of photoelectric conversion elements and that each include a plurality of refractive index materials varying according to wavelengths and having a pitch smaller than a target light wavelength, each of the plurality of metasurface elements separating, by wavelengths, light having passed through the complementary color filters, into components through the plurality of refractive index materials, and guiding the components of the light separated by wavelengths toward the corresponding photoelectric conversion elements.

REFERENCE SIGNS LIST

1, 1A, 1B, 1C, 1D, 1E, 1F, 1G, 1H, 1I, 1J, 1K, 1L, 1M: Optical detector
10: Pixel array section
11, 12, 41, 42: Signal line
20: Vertical driving section
22: Wiring layer
30: Column signal processing section
40: Control section
100: Pixel
101, 101B, 101G, 101R: Photoelectric conversion element
101B1, 101B2, 101G1, 101G2, 101R1, 101R2: Split photoelectric conversion element
102: Electric-charge retaining section
103, 104, 105, 106: MOS transistor
110, 110A, 110B, 110C, 110D, 110E, 110F, 110G, 110H, 110I, 110J, 110K, 110L, 110M: Photoelectric conversion layer
120, 120A, 120B, 120C, 120D, 120E, 120F, 120G, 120H, 120I, 120J, 120K, 120L, 120M: Metasurface layer
121C, 121M, 121Y: Metasurface element
1211, 121C1-1, 121C1-2, 121C2-1, 121C2-2, 121C3-1, 121C3-2, 121C4-1, 121C4-2, 121Y1-1, 121Y1-2, 121Y2-1, 121Y2-2, 121Y3-1, 121Y3-2, 121Y4-1, 121Y4-2: High-refractive index material
130, 130A, 130B, 130C, 130D, 130E, 130F, 130G, 130H, 130I, 130J, 130K, 130L, 130M: Filter layer
131, 131C, 131M, 131Y: Complementary color filter
140, 150: On-chip lens
160, 161B, 161G, 161R: Primary color filter
1212: Low-refractive index material
12000: Vehicle control system
12001: Communication network
12010: Driving system control unit
12020: Body system control unit
12030: Outside-vehicle information detecting unit

12031: Imaging section
12040: In-vehicle information detecting unit
12041: Driver state detecting section
12050: Integrated control unit
12051: Microcomputer
12052: Sound/image output section
12061: Audio speaker
12062: Display section
12063: Instrument panel
12100: Vehicle
12101, 12102, 12103, 12104, 12105: Imaging section
12111, 12112, 12113, 12114: Imaging range

The invention claimed is:

1. An optical detector, comprising:
- a photoelectric conversion layer that includes a plurality of photoelectric conversion elements in a matrix shape, wherein the plurality of photoelectric conversion elements is configured to generate, based on incident light, electric charges by photoelectric conversion;
- a filter layer including a plurality of complementary color filters, wherein
  - the plurality of complementary color filters is on an incident surface of the photoelectric conversion layer,
  - each complementary color filter of the plurality of complementary color filters is associated with a corresponding set of photoelectric conversion elements of the plurality of photoelectric conversion elements, and
  - each complementary color filter of the plurality of complementary color filters is configured to block first light of a specific wavelength in the incident light; and
- a metasurface layer including a plurality of metasurface elements, wherein
  - the plurality of metasurface elements is between the photoelectric conversion layer and the filter layer,
  - each metasurface element of the plurality of metasurface elements is associated with the corresponding set of photoelectric conversion elements,
  - each metasurface element of the plurality of metasurface elements includes a plurality of refractive index materials,
  - the plurality of refractive index materials has:
    - a plurality of different widths based on wavelengths of the incident light, and
    - a pitch smaller than a target light wavelength associated with the incident light, and
  - each metasurface element of the plurality of metasurface elements is configured to:
    - separate, into components, second light of the incident light that has passed through a complementary color filter of the plurality of complementary color filters, wherein
      - the separation of the second light is based on wavelengths of the second light, and
      - the separation of the second light into the components is via the plurality of refractive index materials of a corresponding metasurface element of the plurality of metasurface elements; and
    - guide the components of the separated second light toward the corresponding set of photoelectric conversion elements.

2. The optical detector according to claim 1, wherein the plurality of complementary color filters includes:
- a plurality of first complementary color filters configured to block third light of the incident light, wherein the plurality of first complementary color filters is in one of a row direction of the optical detector or a column direction of the optical detector, and
- a plurality of second complementary color filters in the one of the row direction or the column direction,
- the plurality of second complementary color filters is configured to block fourth light of the incident light,
- the first light includes the third light and the fourth light, and
- a wavelength of the third light is different from a wavelength of the fourth light.

3. The optical detector according to claim 1, further comprising on-chip lenses between the metasurface layer and the photoelectric conversion layer, wherein
- each on-chip lens of the on-chip lenses is associated with a respective photoelectric conversion element of the corresponding set of photoelectric conversion elements, and
- the on-chip lenses are configured to condense the components of the separated second light.

4. The optical detector according to claim 1, further comprising primary color filters between the metasurface layer and the photoelectric conversion layer, wherein
- each primary color filter of the primary color filters is associated with a respective photoelectric conversion element of the corresponding set of photoelectric conversion elements, and
- each primary color filter of the primary color filters is configured to allow third light of a specific wavelength in the separated second light to pass therethrough.

5. The optical detector according to claim 1, further comprising:
- on-chip lenses between the metasurface layer and the photoelectric conversion layer, wherein
  - each on-chip lens of the on-chip lenses is associated with a respective photoelectric conversion element of the corresponding set of photoelectric conversion elements, and
  - the on-chip lenses are configured to condense the light components of the separated second light; and
- primary color filters between the on-chip lenses and the photoelectric conversion layer, wherein
  - each primary color filter of the primary color filters is associated with a respective photoelectric conversion element of the corresponding set of photoelectric conversion elements, and
  - each primary color filter of the primary color filters is configured to allow third light of a specific wavelength in the separated second light to pass therethrough.

6. The optical detector according to claim 1, wherein
- in the photoelectric conversion layer, each photoelectric conversion element of the plurality of photoelectric conversion elements is split into a plurality of split photoelectric conversion elements of a same color, and
- each photoelectric conversion element of the plurality of photoelectric conversion elements is further configured to execute an image plane phase difference function based on outputs of the plurality of split photoelectric conversion elements of a corresponding photoelectric conversion element of the plurality of photoelectric conversion elements.

7. The optical detector according to claim 1, further comprising a plurality of pixels, wherein each pixel of the plurality of pixels includes a respective photoelectric conversion element of the plurality of photoelectric conversion elements, and in a case where a width of each pixel of the plurality of pixels corresponds to a cycle, each complementary color filter of the plurality of complementary color filters and each metasurface element of the plurality of metasurface elements are deviated from a respective photoelectric conversion element of the plurality of photoelectric conversion elements by half of the cycle.

8. The optical detector according to claim 1, wherein the plurality of refractive index materials of each metasurface element of the plurality of metasurface elements includes a pair of refractive index materials, the pair of refractive index materials has one of line shapes or pillar shapes.

9. The optical detector according to claim 8, wherein the plurality of refractive index materials of each metasurface element of the plurality of metasurface elements includes a plurality of pairs of refractive index materials, the plurality of pairs of refractive index materials includes the pair of refractive index materials, and the plurality of pairs of refractive index materials has the pillar shapes.

10. The optical detector according to claim 3, wherein each on-chip lens of the on-chip lenses has one of a circular shape or a box-like shape.

11. An electronic apparatus, comprising:

an optical detector including:

a photoelectric conversion layer that includes a plurality of photoelectric conversion elements in a matrix shape, wherein the plurality of photoelectric conversion elements is configured to generate, based on incident light, electric charges by photoelectric conversion;

a filter layer including a plurality of complementary color filters, wherein the plurality of complementary color filters is on an incident surface of the photoelectric conversion layer, each complementary color filter of the plurality of complementary color filters is associated with a corresponding set of photoelectric conversion elements of the plurality of photoelectric conversion elements, and each complementary color filter of the plurality of complementary color filters is configured to block first light of a specific wavelength in the incident light; and a metasurface layer including a plurality of metasurface elements, wherein the plurality of metasurface elements is between the photoelectric conversion layer and the filter layer, each metasurface element of the plurality of metasurface elements is associated with the corresponding set of photoelectric conversion elements, each metasurface element of the plurality of metasurface elements includes a plurality of refractive index materials, the plurality of refractive index materials has:

a plurality of different widths based on wavelengths of the incident light, and a pitch smaller than a target light wavelength associated with the incident light, and each metasurface element of the plurality of metasurface elements is configured to:

separate, into components, second light of the incident light that has having passed through a complementary color filter of the plurality of complementary color filters, wherein the separation of the second light is based on wavelengths of the second light, and the separation of the second light into the components is via the plurality of refractive index materials of a corresponding metasurface element of the plurality of metasurface elements; and guide the components of the separated second light toward the corresponding set of photoelectric conversion elements.

12. An optical detector, comprising:

a photoelectric conversion layer that includes a plurality of photoelectric conversion elements in a matrix shape, wherein the plurality of photoelectric conversion elements is configured to generate, based on incident light, electric charges by photoelectric conversion;

a filter layer including a plurality of complementary color filters, wherein the plurality of complementary color filters is on an incident surface of the photoelectric conversion layer, each complementary color filter of the plurality of complementary color filters is associated with a corresponding set of photoelectric conversion elements of the plurality of photoelectric conversion elements, and each complementary color filter of the plurality of complementary color filters is configured to block first light of a specific wavelength in the incident light;

a metasurface layer including a plurality of metasurface elements, wherein the plurality of metasurface elements is between the photoelectric conversion layer and the filter layer, each metasurface element of the plurality of metasurface elements is associated with the corresponding set of photoelectric conversion elements, each metasurface element of the plurality of metasurface elements includes a plurality of refractive index materials, the plurality of refractive index materials has:

a plurality of different widths based on wavelengths of the incident light, and a pitch smaller than a target light wavelength associated with the incident light, and each metasurface element of the plurality of metasurface elements is configured to:

separate, into components, second light of the incident light that has passed through a complementary color filter of the plurality of complementary color filters, wherein the separation of the second light is based on wavelengths of the second light, and the separation of the second light into the components is via the plurality of refractive index materials of a corresponding metasurface element of the plurality of metasurface elements; and guide the components of the separated second light toward the corresponding set of photoelectric conversion elements; and primary color filters between the metasurface layer and the photoelectric conversion layer, wherein each primary color filter of the primary color filters is associated with a respective photoelectric conversion element of the corresponding set of photoelectric conversion elements, and each primary color filter of the primary color filters is configured to allow third light of a specific wavelength in the separated second light to pass therethrough.

* * * * *